US006351428B2

(12) United States Patent
Forbes

(10) Patent No.: US 6,351,428 B2
(45) Date of Patent: *Feb. 26, 2002

(54) PROGRAMMABLE LOW VOLTAGE DECODE CIRCUITS WITH ULTRA-THIN TUNNEL OXIDES

(75) Inventor: Leonard Forbes, Corvallis, OR (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/515,115

(22) Filed: Feb. 29, 2000

(51) Int. Cl.[7] ............................. G11C 8/00; G11C 16/04

(52) U.S. Cl. ........................... 365/230.06; 365/185.05; 365/185.23

(58) Field of Search ..................... 365/185.05, 185.09, 365/230.06, 200, 185.23

(56) References Cited

U.S. PATENT DOCUMENTS

| | | | |
|---|---|---|---|
| 3,387,286 A | 6/1968 | Dennard | 340/173 |
| 4,051,354 A | 9/1977 | Choate | 235/312 |
| 4,313,106 A | 1/1982 | Hsu | 340/825.91 |
| 4,471,240 A * | 9/1984 | Novosel | 365/230.06 |
| 5,105,388 A | 4/1992 | Itano et al. | 365/189.08 |

(List continued on next page.)

OTHER PUBLICATIONS

Moore, W.R., "A Review of Fault-Tolerant Techniques for the Enhancement of Integrated Circuit Yield", *Proceedings of the IEEE*, 74(5), 684–698, (May 1986).

Muller, D.A., et al., "The Electronic Structure at the Atomic Scale of Ultrathin Gate Oxides", *Nature*, 399, 758–761, (Jun. 1999).

Ohnakado, T., et al., "1.5V Operation Sector-Erasable Flash Memory with BIpolar Transistor Selected (BITS) P-Channel Cells", *1998 Symposium on VLSI Technology; Digest of Technical Papers*, 1998 VLSI Technology Symposium, Honolulu, 14–15, (1998).

(List continued on next page.)

*Primary Examiner*—Son Mai
(74) *Attorney, Agent, or Firm*—Schwegman, Lundberg, Woessner & Kluth, P.A.

(57) ABSTRACT

Structures and methods are provided for programmable decode circuits which utilize non volatile depletion mode, p-channel floating gate driver transistors. The driver transistors of the present invention have ultra thin gate oxides. The decode circuits of the present invention will work with voltages around one Volt. The decode circuits of the present invention can be programmed with voltages in the range 2.0 to 3.0 Volts. This allows the fabrication of low voltage programmable memory address decode circuits which operate with low voltage power supplies which will be used with CMOS technology which has feature sizes of the order 0.1 $\mu$m, 1000 Å, or 100 nm. The address decoder structure includes a number of address lines and a number of output lines which form an array. A number logic cells are disposed at the intersections of output lines and address lines. Further, a number of depletion mode p-channel memory cells are disposed at the intersections of the address lines and at least one output line. The depletion mode p-channel memory cells have a control gate and a floating gate separated from the control gate by a dielectric layer. According to the teachings of the present invention an oxide layer of less than 50 Angstroms (Å) separates the floating gate from a p-type doped channel region between a source and a drain region in the substrate. According to the teachings of the present invention the floating gate is adapted to hold a fixed charge over a limited range of floating gate potentials or electron energies.

69 Claims, 11 Drawing Sheets

U.S. PATENT DOCUMENTS

| | | | |
|---|---|---|---|
| 5,327,380 A | | 7/1994 | Kersh, III et al. ........... 365/195 |
| 5,464,785 A | | 11/1995 | Hong ........................... 437/43 |
| 5,555,206 A | * | 9/1996 | Uchida ........................ 365/149 |
| 5,559,449 A | | 9/1996 | Padoan et al. ................ 326/40 |
| 5,579,259 A | | 11/1996 | Samachisa et al. ..... 365/185.14 |
| 5,608,670 A | * | 3/1997 | Akaogi et al. .......... 365/185.23 |
| 5,671,178 A | * | 9/1997 | Park et al. ............. 365/185.09 |
| 5,740,104 A | | 4/1998 | Forbes .................. 365/185.03 |
| 5,754,477 A | | 5/1998 | Forbes .................. 365/185.33 |
| 5,790,455 A | | 8/1998 | Caywood ............... 365/185.06 |
| 5,801,401 A | | 9/1998 | Forbes ......................... 257/77 |
| 5,852,306 A | | 12/1998 | Forbes ....................... 257/315 |
| 5,936,274 A | | 8/1999 | Forbes et al. ............... 257/315 |
| 5,959,896 A | | 9/1999 | Forbes .................. 365/185.33 |
| 5,973,356 A | | 10/1999 | Noble et al. ................. 257/319 |
| 5,991,225 A | | 11/1999 | Forbes et al. .......... 365/230.06 |
| 6,124,729 A | | 9/2000 | Noble et al. .................. 326/41 |
| 6,137,725 A | * | 10/2000 | Caser et al. ........... 365/185.23 |

OTHER PUBLICATIONS

Ohnakado, T., et al., "Novel Electron Injection Method Using Band–to–Band Tunneling Induced Hot Electron (BBHE) for Flash Memory with a P–Channel Cell", *1995 International Electron Devices Meeting Technical Digest*, Washington D.C.,, 11.5.1–11.5.4, (1995).

Ohnakado, T., et al., "Novel Self–Limiting Program Scheme Utilitzing N–Channel Select Transistors in P–Channel DINOR Flash Memory", *1996 International Electron Devices Meeting Technical Digest*, San Francisco, CA, 7.4.1–7.4.4, (1996).

Papadas, C., et al., "Modeling of the Intrinsic Retention Characteristics of FLOTOX EEPROM Cells Under Elevated Temperature Conditions", *IEEE Transaction on Electron Devices*, 42, 678–682, (Apr. 1995).

Patel, N.K., et al., "Stress–Induced Leakage Current in Ultrathin SiO2 Films", *Appl. Phys. Letters*, 64(14), 1809–1811, (Apr. 4, 1994).

Salm, C., et al., "Gate Current and Oxide Reliability in p+ Poly MOS Capacitors with Poly–Si and Poly–Ge0.3Si0.7 Gate Material", *IEEE Electron Device Letters 19*(7), 213–215, (Jul. 1998).

Shi, Y., et al., "Tunneling Leakage Current in Ultrathin (<4 nm) Nitride/Oxide Stack Dielectrics", *IEEE Electron Device Letters*, 19(10), 388–390, (Oct. 1998).

Wu, Y., et al., "Time Dependent Dielectric Wearout (TDDW) Technique for Reliability of Ultrathin Gate Oxides", *IEEE Electron Device Letters*, 20(6), 262–264, (Jun. 1999).

"Frequently–Asked Questions (FAQ) About Programmable Logic", http://www.OptiMagic.com/faq.html, 15 pages, (1997).

Chen, I., et al., "A Physical Model for the Gate Current Injection in p–Channel MOSFET's", *IEEE Electron Device Letters*, 14(5), 228–230, (May 1993).

Chen, J., et al., "Hot Electron Gate Current and Degradation in P–Channel SOI MOSFET's", *1991 IEEE International SOI Conference Proceedings*, Vail Valley, Colorado, 8–9, (Oct. 1–3, 1991).

Dipert, B., et al., "Flash Memory Goes Mainstream", *IEEE Spectrum*, 30, 48–52, (Oct. 1993).

Ghodsi, R., et al., "Gate–Induced Drain–Leakage in Buried–Channel PMOS–A Limiting Factor in Development of Low–Cost, High–Performance 3.3–V, 0.25–um Technology", *IEEE Electron Device Letters*, 19(9), 354–356, (Sep. 1998).

Hodges, D.A., et al., "Analysis and Design of Digital Integrated Circuits", McGraw–Hill Book Company, 2nd Edition, 394–396, (1988).

Rhyne (1973) In: Fundamentals of Digital Systems Design, New Jersey, pp. 70–71.

* cited by examiner

| A1 | $\overline{A1}$ | A2 | $\overline{A2}$ | A3 | $\overline{A3}$ | | V |
| 0 | 1 | 0 | 1 | 0 | 1 | | |
|---|---|---|---|---|---|---|---|
|  | NC |  | NC |  | NC | R1 | -VDD HIGH |
| NC | 1 | 0 | NC | 0 | NC | R2 | LOW |
| 0 | NC | NC | 1 | 0 | NC | R3 | LOW |
| NC | 1 | NC | 1 | 0 | NC | R4 | LOW |

FIG. 5B

| A1 | $\overline{A1}$ | A2 | $\overline{A2}$ | A3 | $\overline{A3}$ | | V |
| 1 | 0 | 0 | 1 | 0 | 1 | | |
|---|---|---|---|---|---|---|---|
| 1 | NC | 0 | NC | 0 | NC | R1 | LOW |
| NC | 0 | 0 | NC | 0 | NC | R2 | -VDD HIGH |
| 1 | NC | NC | 1 | 0 | NC | R3 | LOW |
| NC | 0 | NC | 1 | 0 | NC | R4 | LOW |

FIG. 5C

| A1 | $\overline{A1}$ | A2 | $\overline{A2}$ | A3 | $\overline{A3}$ | | V |
| 1 | 0 | 0 | 1 | 0 | 1 | | |
|---|---|---|---|---|---|---|---|
| NC | C | C | NC | C | NC | RD | -VDD HIGH |

PROGRAMMABLE LOW VOLTAGE DECODE CIRCUITS WITH ULTRA-THIN TUNNEL OXIDES

CROSS REFERENCE TO RELATED APPLICATIONS

This application is related to the following co-pending, commonly assigned U.S. patent applications: "Dynamic Flash Memory Cells with UltraThin Tunnel Oxides," Ser. No. 09/513,938, filed Feb. 28, 2000, "P-Channel Dynamic Flash Memory Cells with UltraThin Tunnel Oxides,", Ser. No. 09/514,627, filed Feb. 28, 2000, each of which disclosure is herein incorporated by reference. This application is further related to the following co-pending, commonly assigned U.S. patent applications: "Static NVRAM with Ultra Thin Tunnel Oxides,", Ser. No. 09/515,630, filed Feb. 29, 2000, and "Low Voltage PLA's with UltraThin Tunnel Oxides,", Ser. No. 09/515,759, filed Feb. 29, 2000, which are filed on even date herewith and each of which disclosure is herein incorporated by reference.

FIELD OF THE INVENTION

The present invention relates generally to semiconductor integrated circuits and, more particularly, to structures and methods for programmable low voltage decode circuits with ultra thin tunnel oxides.

BACKGROUND OF THE INVENTION

Electrically erasable and programmable read only memories (EEPROMs) provide nonvolatile data storage. EEPROM memory cells typically use field-effect transistors (FETs) having an electrically isolated (floating) gate that affects conduction between source and drain regions of the FET. A gate dielectric is interposed between the floating gate and an underlying channel region between source and drain regions. A control gate is provided adjacent to the floating gate, separated therefrom by an intergate dielectric.

In such memory cells, data is represented by charge stored on the polysilicon floating gates. The charge is placed on the floating gate during a write operation using a technique such as hot electron injection or Fowler-Nordheim (FN) tunneling. Fowler-Nordheim tunneling is typically used to remove charge from the polysilicon floating gate during an erase operation. At the present time, FN tunneling is primarily used (see generally, T. P. Ma et al., "Tunneling leakage current in ultrathin (<4 nm) nitride/oxide stack dielectrics," IEEE Electron Device Letters, vol. 19, no. 10, pp. 388–390, 1998) as shown in FIG. 1A where the electrons are injected into the conduction band of the oxide by driving the floating gate with a negative potential. Another type of tunneling which has been used is band to band, BTB, tunneling (see generally C. Salm et al., "Gate current and oxide reliability in P+ poly MOS capacitors with poly-Si and Poly-$Ge_{0.3}Si_{0.7}$ gate material," IEEE Electron Device Letters, vol. 19, no. 7, pp. 213–215, July 1998) as shown in FIG. 1B where electrons tunnel out of the valence band, in this case of the silicon substrate, on to the floating gate which is driven to a positive potential.

A flash EEPROM cell has the potential to be smaller and simpler than today's conventional dynamic random access memory (DRAM) cell. One of the limitations to shrinking a flash EEPROM memory cell has been the requirement for a silicon dioxide gate insulator thickness of approximately 10 nm between the floating polysilicon gate and the silicon substrate forming the channel of a flash field effect transistor. This gate thickness is required to prevent excess charge leakage from the floating gate that would reduce data retention time (targeted at approximately 10 years)

Current n-channel flash memories utilize a floating polysilicon gate over a silicon dioxide gate insulator of thickness of the order 100 Å or 10 nm in a field effect transistor. (See generally, B. Dipert et al., IEEE Spectrum, pp. 48–52 (Oct. 1993). This results in a very high barrier energy of around 3.2 eV for electrons between the silicon substrate and gate insulator and between the floating polysilicon gate and silicon oxide gate insulator. This combination of barrier height and oxide thickness results in extremely long retention times even at 250 degrees Celsius. (See generally, C. Papadas et al., IEEE Trans, on Electron Devices, 42, 678–681 (1995)). The simple idea would be that retention times are determined by thermal emission over a 3.2 electron volt (eV) energy barrier, however, these would be extremely long so the current model is that retention is limited by F-N tunneling off of the charged gate. This produces a lower "apparent" activation energy of 1.5 eV which is more likely to be observed. Since the retention time is determined either by thermal excitation of electrons over the barrier or the thermally assisted F-N tunneling of electrons through the oxide, retention times are even longer at room temperature and/or operating temperatures and these memories are for all intensive purposes non-volatile and are also known as non volatile random access memories (NVRAMs). This combination of barrier height and tunnel oxide thickness is not an optimum value in terms of transfer of electrons back and forth between the substrate and floating gate and results in long erase times in flash memories, typically of the order of milliseconds. To compensate for this, a parallel erase operation is performed on a large number of memory cells to effectively reduce the erase time, whence the name "flash" or "flash EEPROM" originated since this effective erase time is much shorter than the erase time in EEPROMs.

P-channel flash memory cells, having gate oxide thicknesses of approximately 100 Å, have been reported (see generally, T. Ohnakado et al., Digest of Int. Electron Devices Meeting, Dec. 10–13, 1995, Washington D. C., pp. 279–282; T. Ohnakado et al., Digest of Int. Electron Devices Meeting, Dec. 8–11, 1996, San Francisco, pp. 181–184; T. Ohnakado et al., Proc. Symposium on VLSI Technology, Jun. 9–11, 1998), Honolulu, HI, pp. 14–15) and disclosed (see U.S. Pat. No. 5,790,455, issued Aug. 4, 1998, entitled "Low voltage single supply CMOS electrically erasable read-only memory"). These reported and disclosed p-channel flash memory cells work similar to n-channel flash memory cells in that they utilize hot electron effects to write data on to the floating gate. If the magnitude of the drain voltage in a PMOS transistor is higher than the gate voltage, then the electric field near the drain through the gate oxide will be from the gate (most positive) towards the drain (most negative). This can and will cause hot electrons to be injected into the oxide and collected by the floating gate. The mechanisms reported are either channel hot electron injection, CHE, or band-to-band tunneling induced hot electron injection, BTB. The gate current in PMOS transistors (see generally, I. C. Chen et al., IEEE Electron Device Lett., 4:5, 228–230 (1993); and J. Chen et al., Proceedings IEEE Int. SOI Conf. Oct. 1–3, 1991, pp. 8–9) can actually be much higher than the gate current in NMOS transistors (see generally, R. Ghodsi et al., IEEE Electron Device Letters, 19:9, 354–356 (1998)) due to the BTB tunneling. Negatively, higher gate current in the PMOS transistors resulting from this BTB tunneling effect limits the reliability of deep sub-micron CMOS technology, as reported by R.

Ghodsi et al. In other words, the reliability of the PMOS array is lowered because of this higher current in the PMOS device.

In co-pending, commonly assigned U.S. patent applications: entitled "Dynamic Flash Memory Cells with UltraThin Tunnel Oxides," Ser. No. 09/513,938, filed Feb. 28, 2000, and "P-Channel Dynamic Flash Memory Cells with UltraThin Tunnel Oxides," Ser. No. 09/514,627, filed Feb. 28 ,2000, dynamic memory cells base on floating gates, like those in flash memory cells, over ultrathin tunneling oxides, are disclosed. In these cases write and erase was accomplished by tunneling through the ultrathin gate oxides. The dynamic nature of the cell resulted from using relatively speaking larger potential variations and amounts of charge stored on the floating gates, as a consequence charge could leak on to, or off of, the floating gate by tunneling of carriers to allowed states in the conduction bands of the insulator, FN tunneling, or semiconductor by band to band, BTB, tunneling. The transistors employed there were normal enhancement mode n-channel MOSFETs, or enhancement mode PMOSFETs. However, the dynamic nature of the cells disclosed therein are not suited for the non volatile requirements of decode circuits.

As described above, tunneling has long been used in the erase operation of flash memory devices. Such flash memory devices have further been used in field programmable logic devices such as circuit programmable logic devices, programmable memory address decode and fault-tolerant memory arrays, and embedded functions. However, the use of conventional flash memory devices in such circuit applications suffer the above described drawbacks relating to the speed of the write and erase functions as well as the amount of power consumption.

Thus, there remains a need in the art to develop "static," non volatile floating gate transistors, or flash memory cells which can be more successfully implemented in decode circuit applications. Such non volatile floating gate transistors, or flash memory cells should desirably be able to scale down with shrinking design rules and usefully be implemented with ultra thin tunnel gate oxide thicknesses of less than the conventional 100 Å thick tunnel oxides. That is, it is desirable to develop improved decode circuits which are more responsive, providing faster write and erase times and which can work with much lower voltages than conventional flash memory type devices used in current decode circuit technology. It is further desirable that such decode circuits have a reliability of a number of cycles of performance equivalent or greater than that of current decode circuits using conventional non volatile memory cells and be capable of performing decode operations at a rate comparable to or faster than that of conventional decode circuits.

SUMMARY OF THE INVENTION

In the co-filed, co-pending, commonly assigned U.S. patent application: entitled "Static NVRAM UltraThin Tunnel Oxides,", Ser. No. 09/515,630, filed Feb. 29, 2000 which disclosure is herein incorporated by reference, static non volatile memory cells, NVRAMs, which behave like SRAMs are disclosed.

The present invention describes systems and methods for programmable decode circuits which utilize such a static non volatile memory cell. The programmable depletion mode, p-channel floating gate driver transistors with ultra thin gate oxides will normally work with voltages around one Volt. The decode circuits of the present invention can be programmed with voltages in the range 2.0 to 3.0 Volts. This allows the fabrication of low voltage programmable memory address decode circuits which operate with low voltage power supplies which will be used with CMOS technology which has feature sizes of the order 0.1 $\mu$m, 1000 Å, or 100 nm.

The devices are not similar to normal flash memory devices but rather employ a unique device structure and operating conditions to achieve a nonvolatile memory function. There is a range of floating gate potentials over which charge can not leak off of the floating gate since there are no final states to which the electrons can tunnel to in the silicon substrate. In this manner ultrathin gate oxides can be used as to provide a nonvolatile memory function and the transistor in the decode circuit can be programmed to perform different logic functions. Further, the decode circuits of the present invention are well suited to scale with the shrinking design rules of integrated circuit technology.

According to one embodiment of the present invention, an address decoder for a memory device is provided. The address decoder includes a number of address lines and a number of output lines which form an array. A number logic cells are disposed at the intersections of output lines and address lines. Further, a number of non volatile memory cells are disposed at the intersections of the address lines and at least one output line. The number of non volatile memory cells include depletion mode p-channel memory cells. The depletion mode p-channel memory cells have a control gate and a floating gate separated from the control gate by a dielectric layer. According to the teachings of the present invention an oxide layer of less than 50 Angstroms (Å) separates the floating gate from a p-type doped channel region between a source and a drain region in the substrate.

According to another embodiment of the present invention, a method for enabling error correction in a decode circuit which has a number of non volatile, depletion mode p-channel floating gate transistors coupled to a redundant row line is provided. The method includes selectively storing a limited charge on at least one of the floating gates for the number of non volatile depletion mode p-channel floating gate transistors. Selectively storing the limited charge on the at least one of the floating gates controls addressing the redundant row line. The method further includes applying a limited range of floating gate potentials to the number of non volatile, depletion mode p-channel floating gate transistors using a number of address lines. In one embodiment, applying a limited range of floating gate potentials to the number of non volatile, depletion mode p-channel floating gate transistors in the decode circuit includes applying a limited range of floating gate potentials of approximately +/−1.0 Volts. One embodiment of this method includes applying a limited range of floating gate potentials using a negative logic system. In one embodiment, the method also includes selectively removing a limited charge on at least one of the floating gates for the number of number of non volatile depletion mode p-channel floating gate transistors. According to the teachings of the present invention, selectively removing the limited charge on the at least one of the floating gates effectively removes that for the number of non volatile depletion mode p-channel floating gate transistors from the decode.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

FIG. 5B shows the truth table for addressing row line R1 in the negative logic system decode circuit 500 configuration of FIG. 5A.

FIG. 5C shows the truth table for addressing row line R2 in the negative logic system decode circuit 500 configuration of FIG. 5A.

FIG. 5D illustrates one example of a "programmed" embodiment of additional devices, in decode circuit 500 to provide error correction and replacement of row line R2 according to the teachings of the present invention.

DESCRIPTION OF THE PREFERRED EMBODIMENTS

Figure 1A:
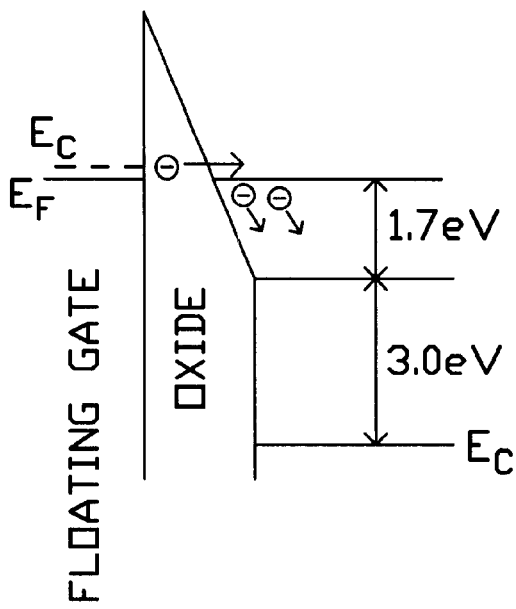
FIGS. 1A and 1B are energy band diagram which illustrates generally F-N tunneling and Band to Band (BTB) tunneling of stored electrons off of and on to a floating gate according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The terms wafer and substrate used in the following description include any base semiconductor structure. Both are to be understood as including bulk silicon material, silicon-on-sapphire (SOS) technology, silicon-on-insulator (SOI) technology, thin film transistor (TFT) technology, doped and undoped semiconductors, epitaxial layers of silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure and layer formed above, and the terms wafer or substrate include the underlying layers containing such regions/junctions and layers that may have been formed above. The term conductor is understood to include semiconductors, and the term insulator is defined to include any material that is less electrically conductive than the materials referred to as conductors.

Enhancement mode means that if the transistors have a threshold voltage of some magnitude, VT, then the conduction is enhanced by applying a magnitude of the gate voltage, VGS, in excess of the threshold voltage to attract electrons or holes respectively to the channel and cause conduction between the source and drain. Depletion mode devices, on the other hand, are normally "on" and conduct with no applied gate voltage. The following detailed description is not to be taken in a limiting sense, and the scope of the present invention is defined only by the appended claims, along with the full scope of equivalents to which such claims are entitled.

Figure 2A:
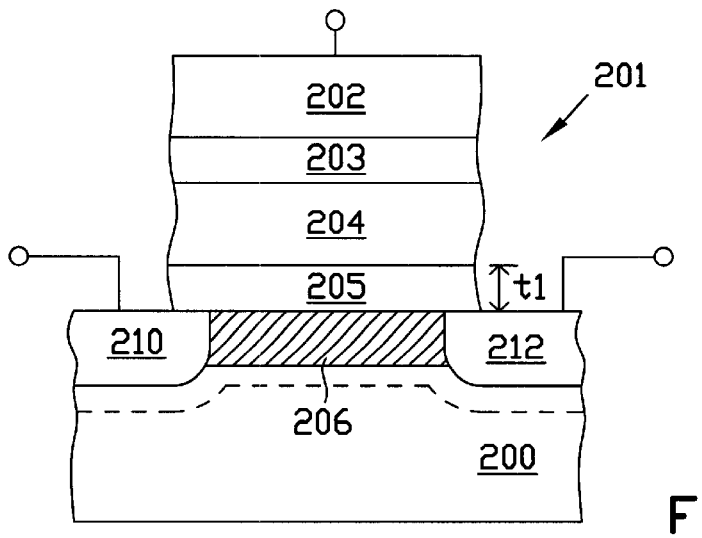
FIG. 2A illustrates a "static," non volatile, "depletion mode" p-channel floating gate transistor, or p-channel memory cell having a tunnel gate oxide of less than 50 Angstroms according to the teachings of the present invention.

FIG. 2A shows the basic structure of the static, non volatile memory cell, used in the present invention, which is similar to a flash memory device, except here the tunnel oxide is an ultrathin tunnel oxide and the conduction channel is implanted p-type to make a to depletion mode device, rather than the usual enhancement mode n-channel transistor. Thus, FIG. 2A illustrates a "static," non volatile, "depletion mode" p-channel floating gate transistor, or p-channel memory cell 201 having a tunnel gate oxide of less than 50 Angstroms according to the teachings of the present invention. The depletion mode p-channel flash memory cell 201 includes a depletion mode p-channel floating gate transistor. As shown in FIG. 2A, the depletion mode p-channel flash memory cell 201 of the present invention includes a control gate 202 and a floating gate 204 which can be driven at different potentials. The control gate 202 is separated from the floating gate 204 by an intergate dielectric layer, or intergate oxide 203. In one embodiment the intergate dielectric layer 203 includes a layer of silicon dioxide (SiO). In an alternative embodiment, the intergate dielectric layer 203 includes a silicon nitride layer ($Si_3N_4$) or any other suitable dielectric layer 203, the invention is not so limited.

FIG. 2A illustrates that the floating gate 204 is separated by an oxide layer, or tunnel gate oxide 205, from a channel region 206. The channel region 206 separates a source region 210 from a drain region 212 in a substrate 200. As one of ordinary skill in the art will understand upon reading this disclosure the source and drain regions, 210 and 212 respectively, include p-type doped source and drain regions, 210 and 212. The p-type doped source and drain regions, 210 and 212, can include heavily doped (p+) source and drain regions, 210 and 212. The substrate includes an n-type substrate or n-well 200.

According to the teachings of the present invention, the oxide layer 205 is an oxide layer which has a thickness (t1) of less than 50 Angstroms (Å). In one embodiment of the present invention, the oxide layer is approximately 30 Angstroms (Å). In one exemplary embodiment of the present invention, the oxide layer is approximately 23 Angstroms (Å). In one exemplary embodiment, the depletion mode p-channel flash memory cell 201 includes an n-type doped polysilicon floating gate 204 and an n-type doped control gate 202. The n-type doped polysilicon floating gate 204 and the n-type doped control gate 202 can include heavily doped (n+) polysilicon floating and control gates, 204 and 202 respectively. As shown in FIG. 2A, the depletion mode p-channel flash memory cell 201 of the present invention has an implanted p-type conduction channel 206 which is normally on or conducting with no applied gate voltage.

As disclosed in the co-filed, co-pending, commonly assigned U.S. patent application: entitled "static NVRAM UltraThin Tunnel Oxides,", Ser. No. 09/515,630, filed Feb. 29, 2000, these device shown in FIG. 2A can be programmed with low voltages or gate oxide electric fields of 10 MV/cm, as for instance 2.3 Volts on 23 Å or 2.3 nm tunnel gate oxides, or 3.0 Volts on 30 Å or 3.0 nm tunnel gate oxides. Also, as disclosed in that application, the depletion mode p-channel flash memory cell 201 works on a different basis to achieve a non-volatile memory function. Normal flash memory devices with ultrathin tunnel oxides would be volatile or not maintain the memory charge state on the floating gate due to tunneling through the ultra thin gate oxide and charge leakage.

As described above, an exemplary embodiment of the depletion mode p-channel flash memory cell 201 normally might employ an n+ polysilicon floating gate 204. However, for simplicity herein, the operation of the depletion mode p-channel flash memory cell's 201 will be described for the embodiment of a p+ polysilicon floating gate 204. Either type of floating gate will work, and one of ordinary skill in the art will understand the comparable operation of the present invention for the embodiment of an n+ polysilicon floating gate 204. The operation is simpler to describe with p+ floating gate 204 because the work function difference between the floating gate 204 and p-type channel 206 and p+ source regions 210 will be small. Work function differences just result in gate voltage offsets.

Figure 2B:
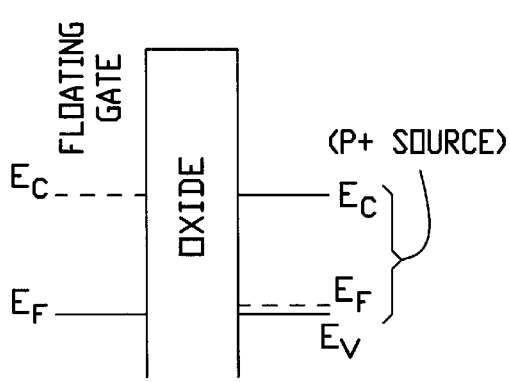
FIG. 2B shows the electron energy and band diagrams for the memory cell of FIG. 2A when the source and floating gate are both at zero or ground potential.

FIG. 2B shows the electron energy and band diagrams for the memory cell of FIG. 2A when the source 210 and floating gate 204 are both at zero or ground potential. As shown in FIG. 2B, the Fermi levels for the source 210 and floating gate 204 are aligned.

Figure 2C:
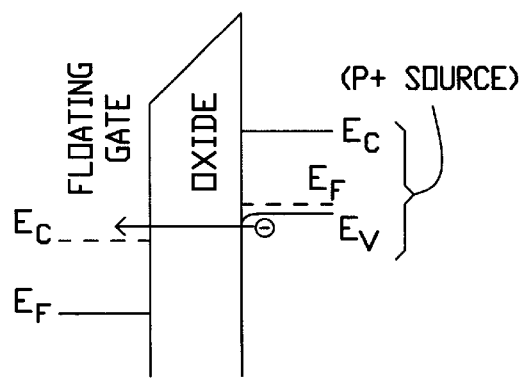
FIG. 2C is an energy band diagram which illustrates generally the write operation for e depletion mode, p-channel flash memory cell according to the teachings of the present invention.

FIG. 2C is an energy band diagram which illustrates generally the write operation for the depletion mode, p-channel flash memory cell according to the teachings of the present invention. As shown in FIG. 2C, a charge can be injected from the p+ source region 210 to the floating gate by driving the control gate 204 to a large positive voltage which increases the potential of the floating gate, reduces electron energy, and causes valence band electrons in the p+ source region 210 to tunnel on to the floating gate 204. The tunneling of charge to the floating gate can be achieved by FN tunneling, or by band to band, BTB, tunneling. The charge on the floating gate can be changed from a positive value to a neutral or even negative charge condition. The potential of the floating gate will decrease or the energy of electrons on the floating gate will increase. However, if not too many electrons are injected on to the floating gate, e.g. a charge of approximately $10^{-17}$ Coulombs, or approximately 100 electrons for a floating gate having a bottom surface area of approximately $10^{-1}$ cm$^2$ in the device of the present invention having an ultra thin tunnel gate oxide, they can not escape back to the silicon substrate since there are no available states in the silicon to which they can tunnel. When the control gate goes back to ground potential, or a negative potential, electrons will be trapped on the floating gate. These electrons cannot escape by tunneling to the substrate or source until the floating gate potential becomes about one voltage negative and the Fermi energy level in the floating gate aligns with the conduction band in the channel or the source region. In between these two potentials the band gap in the silicon substrate, or p+ source region has no final electron states into which the electrons can tunnel.

Figure 2D:
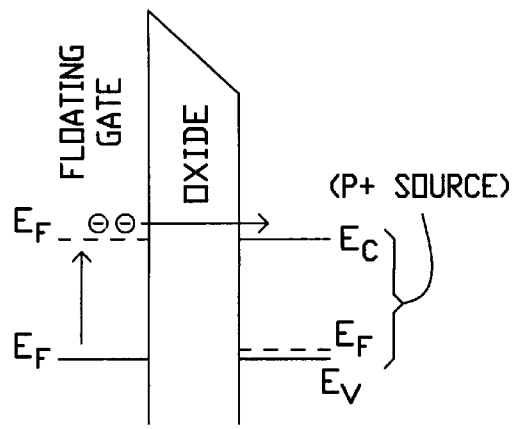
FIG. 2D is an energy band diagram which illustrates the point at which electrons can begin escaping from the floating gate of the memory cell of FIG. 2A by F-N tunneling back to the silicon substrate, or p+ source region.

FIG. 2D is an energy band diagram which illustrates the point at which electrons can begin escaping from the floating gate 204 by F-N tunneling back to the silicon substrate, or p+ source region 210. Once a sufficient negative potential is provided on the floating gate, the Fermi level in the floating gate 204 will be above the energy level of available final states in the substrate 206/200, or p+ source region 210. As long as the floating gate potential does not go too far negative the electron charge will remain on the floating gate.

The erase operation (removing electrons from the floating gate 204) for the depletion mode, p-channel flash memory cell 201 is then performed by driving the control gate to a sufficiently large negative potential. The Fermi level in the floating gate 204 will then be above the energy level of available final states in the substrate 206/200, or p+ source region 210. When the floating gate is driven to this sufficiently large negative potential the electrons can tunnel back to the silicon substrate 206/200, or p+ source region 210, by FN tunneling or BTB tunneling. In this case there is a high density of available final states either in the oxide or silicon substrate/p+ source region conduction bands.

Thus there is a range of floating gate potentials, of about 1 Volt, and floating gate charge where the depletion mode, p-channel flash memory cell 201 can have a fixed charge on the floating gate 204. These different fixed charge states will modulate the conductivity of the p-channel depletion mode transistor beneath the floating gate.

Figure 2E:
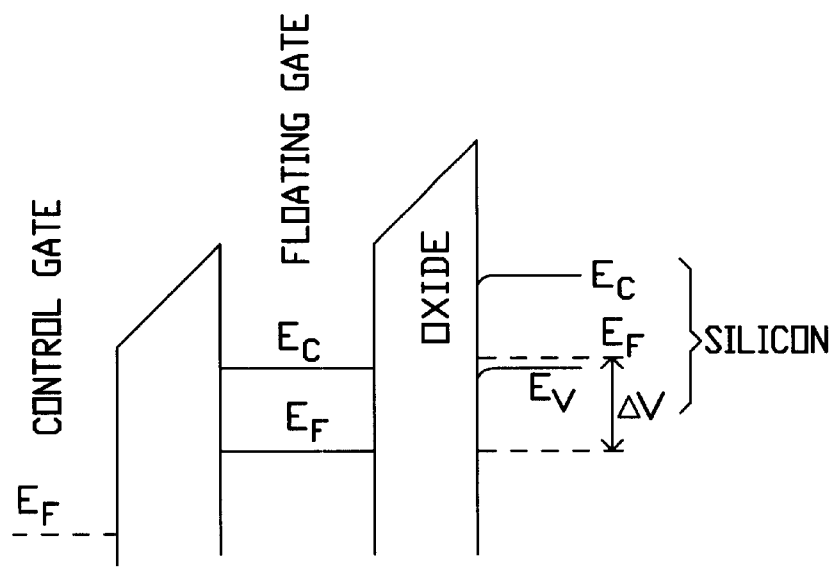
FIGS. 2E and 2F illustrate one embodiment of the operation of the depletion mode, p-channel flash memory cell of the present invention in a fixed charge state of no electrons stored on the floating gate.
Figure 2F:
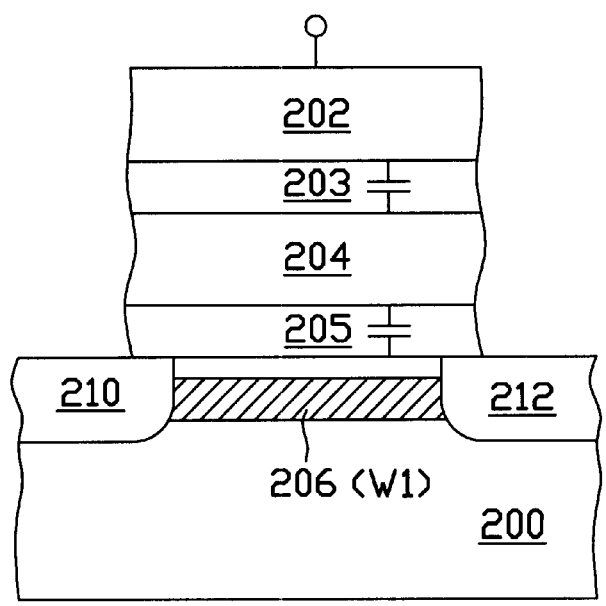

FIGS. 2E and 2F illustrate one embodiment of the operation of the depletion mode, p-channel flash memory cell 201 in a fixed charge state of no electrons stored on the floating gate. The normal operating voltage is with a floating gate potential of about 1.0 Volts or less positive. This floating gate potential is provided by biasing the control gate 202 at a positive voltage slightly in excess of plus 1.0 Volt. As shown in FIG. 2E, the floating gate potential is not driven far enough positive such that the conduction band (Ec) of the floating gate is below the valence band (Ev) of the silicon. Hence no electrons tunnel from the valance band of the silicon on to the floating gate 204.

As shown in FIG. 2F, this normal bias condition does serve to turn "off" the implanted depletion mode p-type channel 206. In other words, as shown in FIG. 2F, the width (W1) of the p-type conduction channel is narrowed.

Figure 2G:
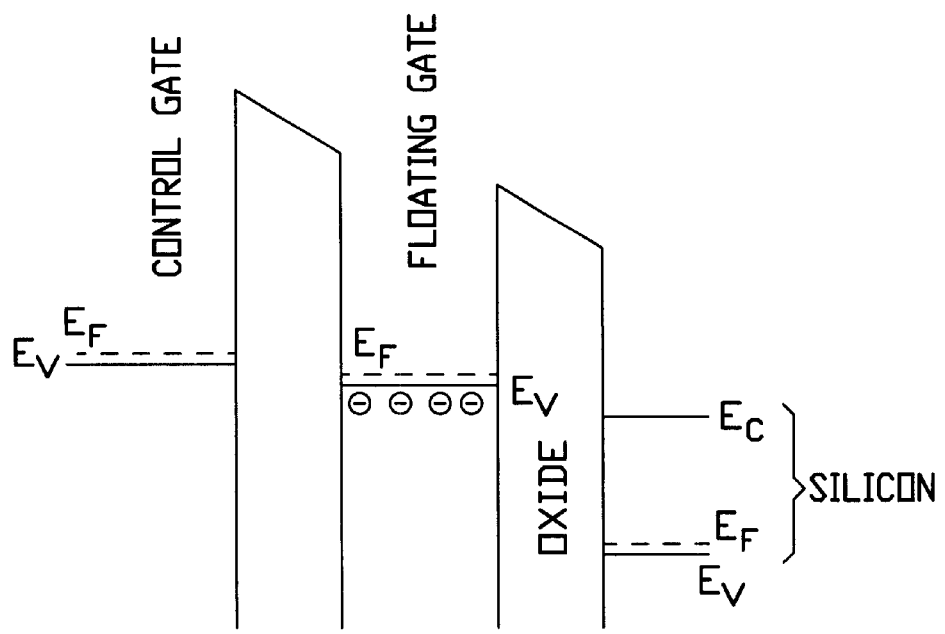
FIGS. 2G and 2H illustrate another embodiment of the operation of the depletion mode, p-channel flash memory cell of the present invention in a different fixed charge state where electrons are stored on the floating gate.
Figure 2H:
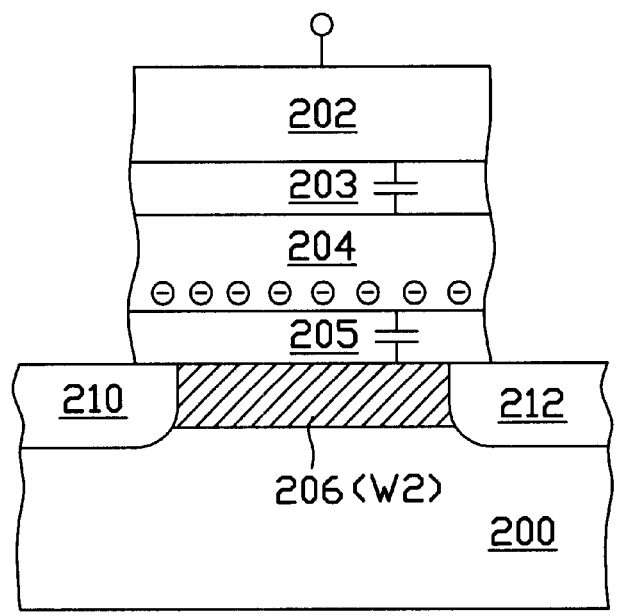

FIGS. 2G and 2H illustrate another embodiment of the operation of the depletion mode, p-channel flash memory cell 201 in a different fixed charge state where electrons are stored on the floating gate 204. According to the teachings of the present invention, if negative charge, electrons are stored on the floating gate 204, then the floating gate potential can be up to 1.0 Volts more negative before electrons can escape as shown in FIG. 2G. As shown in FIG. 2G, the floating gate potential is not driven far enough negative such that the valence band (Ev) of the floating gate is above the conduction band (Ec) of the silicon. Hence, there are no final states in the silicon for the electrons in the floating gate 204 to tunnel to and no electrons tunnel from the floating gate 204 to the silicon or p+ source region 210.

As shown in FIG. 2H, a normal bias condition to the floating gate does not serve to turn "off" the implanted depletion mode p-type channel 206. In other words, as shown in FIG. 2H, the fixed charge state with electrons stored on the floating gate 204 maximizes the width (W2) of the p-type conduction channel. This negative charge on the floating gate 204 will result in a higher conductivity state of the p-type channel.

Thus, according to the teachings of the present invention, under normal operation the depletion mode, p-channel flash floating gate transistor 201 has two different conductivity states depending upon whether electrons are stored on the floating gate. These two different conductivity states includes a low DC conductivity state without stored charge and a higher conductivity state when electrons are stored on the floating gate 204. It is further noted here that the normal control gate operation is employing a positive voltage for programming. This positive voltage is opposite in polarity to the negative control gate voltages normally employed in PMOS circuits.

As mentioned above, n+ polysilicon floating gates 204 can be more convenient to employ in practice since the depletion mode, p-channel flash floating gate transistors 201 will work while requiring less positive control gate voltages. The work function difference in using n+ floating gates and n+ control gates only results in an offset of gate voltages to more negative values.

Figure 1B:
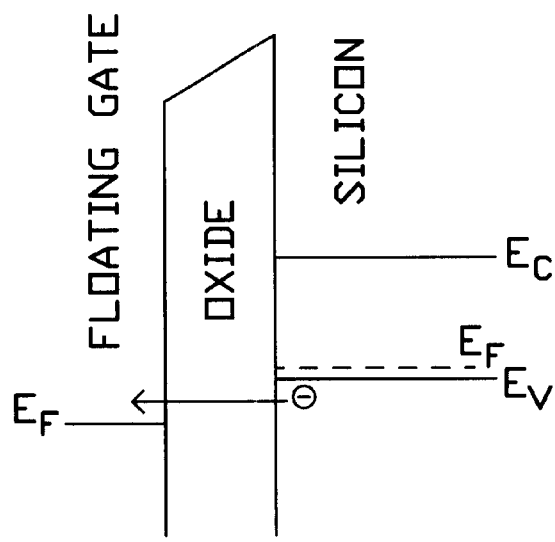
Figure 2I:
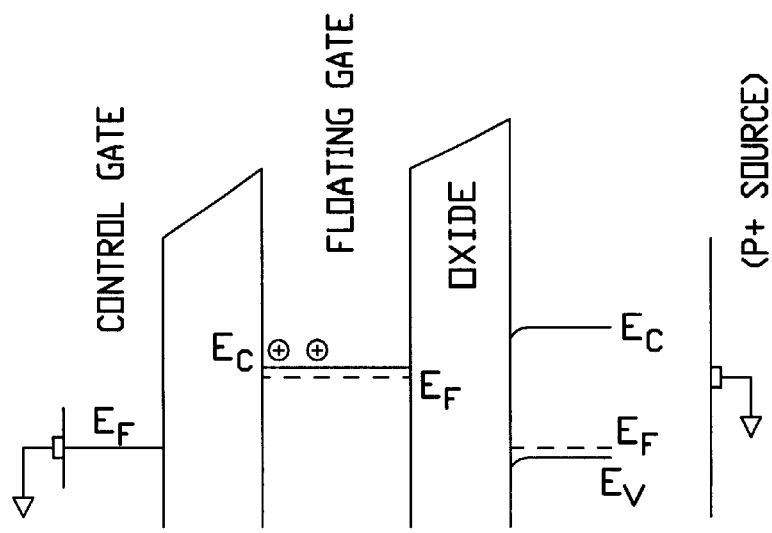
FIGS. 2I and 2J illustrate the equilibrium condition for the depletion mode, p-channel flash floating gate transistor of the present invention with an n+ polysilicon floating gates after a long time has elapsed with the control gate and p+ source region of the transistor grounded.
Figure 2J:
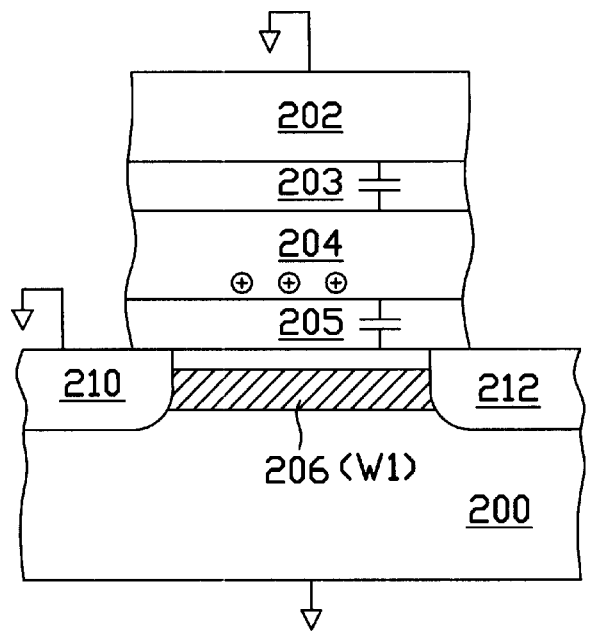

FIGS. 2I and 2J illustrate the equilibrium condition for the depletion mode, p-channel flash floating gate transistor 201 with an n+ polysilicon floating gates 204 after a long time has elapsed with the control gate 202 and p+ source region 210 of the transistor grounded. FIG. 2I is an energy band diagram which illustrates generally the relative valence, conduction, and Fermi energy band levels of the device in an equilibrium condition if the control gate 202 were grounded and after a theoretical infinite amount of time has elapsed. If the control gate 202 is grounded and the source region 210 is grounded then the Fermi level in the control gate 204 and the source region 210 must line up or be at the same potential. The work functions of the n+ poly gates, 202 and 204, and the work function of the p+ silicon source region, 210, are quite different. If the n+ poly control gate 202 is grounded this tends to pull the bands down to a lower energy state, in the same sense that the work function difference in an NMOS transistor on a p-type substrate tends to invert the substrate and try to collect electrons at the silicon surface. If temperatures are high enough and/or enough time has elapsed, this may be a very long time, then the structure must come to thermal equilibrium where the Fermi levels in the control gate and the p+ source region line up and the structure satisfies the electrostatic constraints to be charge neutral. This solution is shown in FIG. 1B where some electrons have escaped from the floating gate 204 and the floating gate 204 has a small positive charge. This solution satisfies all electrostatic and potential considerations and constraints.

Because of the work function difference, the floating gate 204 will equilibrate to a slightly negative potential with a small residual stored charge and the depletion mode, p-channel flash floating gate transistor 201 will be in a low conductivity state, e.g. p-type conduction channel 206 width (W1), as shown in FIG. 2J. If the control gate 202 is stepped negative, the depletion mode, p-channel flash floating gate transistor 201 will turn on to a higher conductivity state, e.g. p-type conduction channel 206 width greater than W1.

Figure 2K:
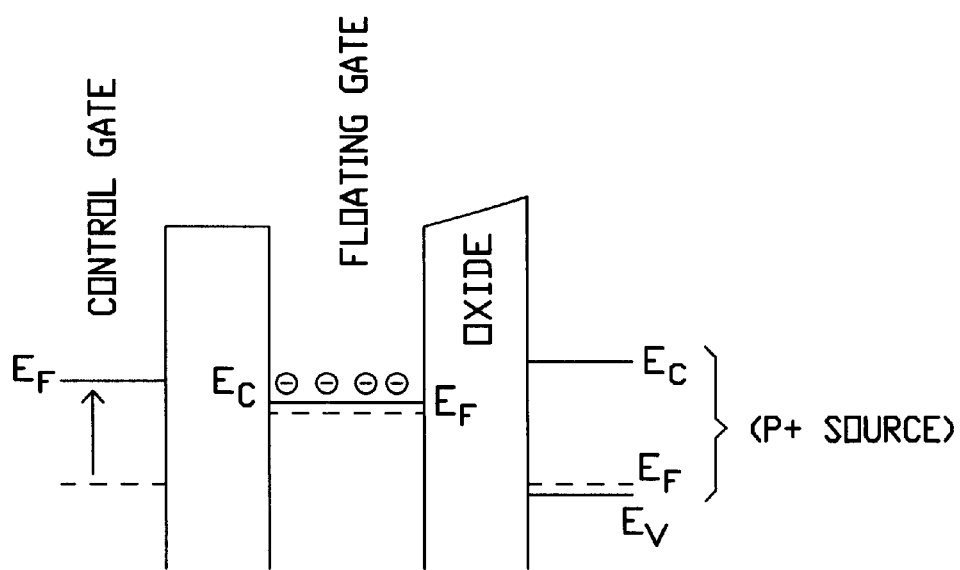
FIGS. 2K and 2L illustrate the device of FIGS. 2I and 2J with a negative charge is stored on the floating gate such that the conductivity of the depletion mode, p-channel floating gate transistor is much higher.
Figure 2L:
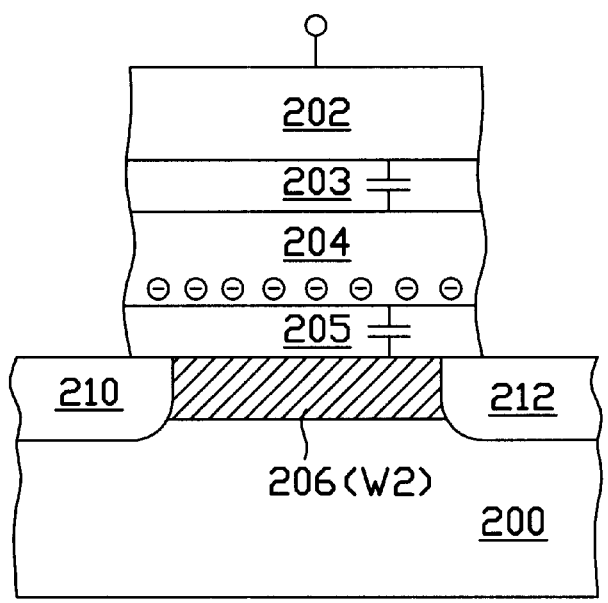

However, as shown in FIGS. 2K and 2L for the same device, if a negative charge is stored on the floating gate 204 then the conductivity of the depletion mode, p-channel flash floating gate transistor 201 will be much higher, e.g. p-type conduction channel 206 width (W2). Hence, the conductivity state of the depletion mode, p-channel flash floating gate transistor 201 of the present invention can be determined with zero volts on the control gate. In the fixed charge state without a stored charge on the floating gate the conductivity will be low. In the fixed charge state with a stored charge of electrons on the floating gate the conductivity will be much higher.

In the co-filed, co-pending, commonly assigned U.S. patent application: entitled "Static NVRAM UltraThin Tunnel Oxides,", Ser. No. 09/515,630, filed Feb. 29, 2000, which disclosure is herein incorporated by reference, static non volatile memory cells, NVRAMs, which behave like SRAMs are disclosed. The manner in which these individual depletion mode, p-channel flash floating gate transistors 201 of the present invention can be selectively programmed was also disclosed. One of ordinary skill in the art will understand upon reading this disclosure, the manner in which the same can be selectively programmed within the programmable logic array (PLA) of the present invention. In the same application, it was described that in a read operation sense time of 1.0 nanosecond, $t_{sense}=1$ ns, that a difference in signal of approximately 100 mV is placed on the drain line, or output line coupled to the drain region 212.

Also, in co-pending, commonly assigned U.S. patent applications: entitled, "Dynamic Flash Memory Cells with UltraThin Tunnel Oxides,", Ser. No. 09/513,938, filed Feb. 18, 2000 and entitled, "P-Channel Dynamic Flash Memory Cells with UltraThin Tunnel Oxides,", Ser. No. 09/514,627, filed Feb. 28, 2000, each of which disclosure is herein incorporated by reference, it was shown that if ultra thin tunnel gate oxides are used then the write, erase, and read operations will be relatively fast as compared with conventional DRAM technology. That is a write and erase time of approximately 200 nanoseconds, if a 2.3 nm or 23 Å gate oxide is used with a voltage of 2.3 Volts, producing an electric field of 10.0 MV/cm. The current density produced is large, approximately 0.5 A/cm$^2$.

Further, in co-pending, commonly assigned U.S. patent applications: entitled, "Dynamic Flash Memory Cells with UltraThin Tunnel Oxides,", Ser. No. 09/513,938,filed Feb. 28, 2000, and entitled, "P-Channel Dynamic Flash Memory Cells with UltraThin Tunnel Oxides,", Ser. No. 09/514,627, filed Feb. 28, 2000, each of which disclosure is herein incorporated by reference, it was further shown that some very long mean times to failure have been reported on ultrathin tunnel oxides. For example, with an electric field in the gate oxide of 10 MV/cm, as disclosed by G. Lucovsky et al., *IEEE Electron Device Letters*, vol. 20: no. 6, pp. 262–264 (1999), these include up to 19 years with 23 Å or 2.3 nm oxides. There is good reason to believe in the case of FN tunneling that there is a minimum potential or energy of around 4.7 V which is required to cause damage in a tunnel gate oxide, 3.0 eV to overcome the silicon-oxide barrier and 1.7 eV required for acceleration of the electrons in the conduction band of the oxide, as disclosed by G. Lucovsky et al., *IEEE Electron Device Letters*, vol. 20: no. 6, pp. 262–264 (1999); and N. Patel et al., *Appl. Phys. Lett.*, vol. 64: no. 14, 1809–11 (1994). This was illustrated in FIG. 1A. In the case of band to band tunneling, BTB, this is a quantum mechanical effect and no direct collisions occur between electrons and atoms in the oxide so again there would be no damage in the oxide. BTB tunneling as applied in these devices is illustrated in FIG. 1B. Recent investigations, as disclosed by D. A. Muller et al. "The electronic structure at the atomic scale of ultrathin gate oxides," Nature, vol. 399, pp. 758–761, Jun. 24, 1999, suggest that gate oxides as thin as 12 Å or 1.2 nm may eventually be used in CMOS devices. Thus, there may be good scientific basis to believe that ultrathin tunnel gate oxides may in fact be much more reliable than the current 100 Å or 10 nm gate oxides used in flash memory devices.

Figure 3A:
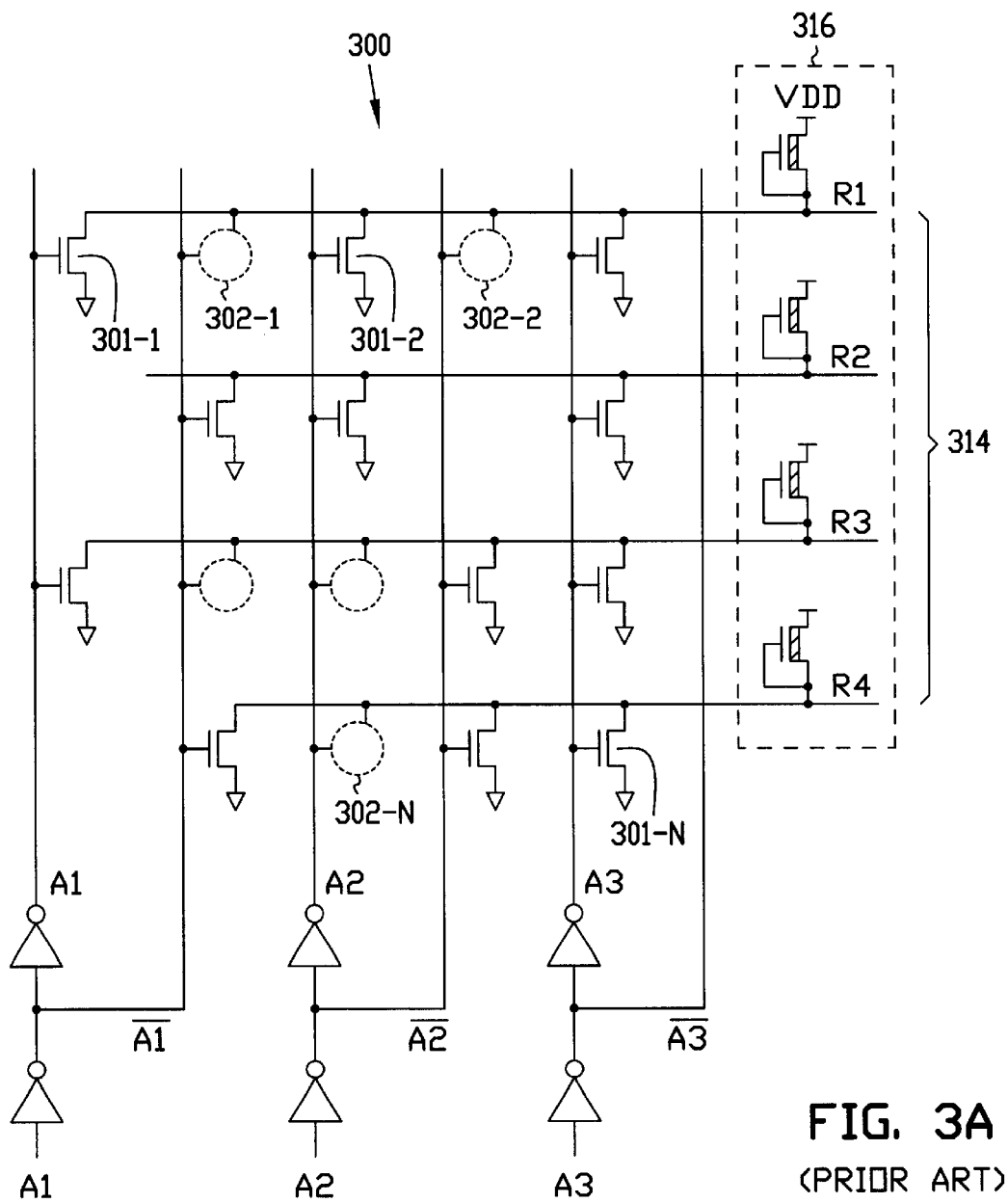
FIG. 3A shows a conventional NOR decode array for memory circuits according to the teachings of the prior art.

FIG. 3A shows a conventional NOR decode array for memory circuits. The address lines are A1 through A3 and inverse address lines, $\overline{A1}$ through $\overline{A3}$. The conventional NOR decode array is programmable at the gate mask level by either fabricating a thin oxide gate transistor, e.g. transistors 301-1, 301-2, . . . , 301-N, at the intersection of lines in the array or not fabricating a thin oxide gate transistor, e.g. missing thin oxide transistors, 302-1, 302-2, . . . , 302-N, at such an intersection. As one of ordinary skill in the art will understand upon reading this disclosure, the same technique is conventionally used to form other types of decode arrays not shown. As shown in FIG. 3A, a number of depletion mode NMOS transistors, 316, are used as load devices.

In this embodiment, each of the row lines 314 acts as a NOR gate for the address lines A1 through A3 and inverse address lines, $\overline{A1}$ through $\overline{A3}$ that are connected to the row lines 314 through the thin oxide gate transistor, e.g. transistors 301-1, 301-2, . . . , 301-N, of the array. That is, row line R1 is maintained at a high potential, +VDD, in the positive logic NMOS decode array shown in FIG. 3A, unless one or more of the thin oxide gate transistor, e.g. transistors 301-1, 301-2, . . . , 301-N, that are coupled to row line R1 are turned on by a high logic level signal, +VDD, on one of the address lines A1 through A3 or inverse address lines, $\overline{A1}$ through $\overline{A3}$. When a transistor gate address is activated, by the high logic level signal, +VDD, through address lines A1 through A3 or inverse address lines, $\overline{A1}$ through $\overline{A3}$, each thin oxide gate transistor, e.g. transistors 301-1, 301-2, . . . , 301-N, conducts, or is turned "on." This conduction of the thin oxide gate transistor, e.g. transistors 301-1, 301-2, . . . , 301-N, performs the NOR positive logic circuit function, an inversion of the OR circuit function results from inversion of data onto the row lines 314 through the thin oxide gate transistor, e.g. transistors 301-1, 301-2, . . . , 301-N, of the array, in order to output a low logic level signal on the row lines 314. Thus, a particular row line 314 is addressed when none of the thin oxide gate transistor, e.g. transistors 301-1, 301-2, 301-N, coupled to that row line 314 are turned "on."

Again, the incoming address on each line is inverted and the combination of the original address and inverted or complemented values used to drive the gates of transistors in the decode array 300. The transistors 301-1, 301-2, . . . , 301-N in the array 300 are enhancement mode NMOS devices and depletion mode NMOS transistors are used as load devices 316. This is a positive logic NOR decode array, the logic one state, "1" is the most positive voltage, +VDD, and the logic level zero, "0" is the least positive voltage or ground.

Figure 3B:
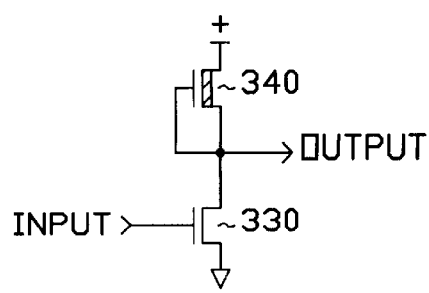
FIG. 3B illustrates in more detail that the transistors used in FIG. 3A are enhancement mode NMOS transistors with a depletion mode NMOS load technology according to the teachings of the prior art.

As shown in FIG. 3B, the transistors used in FIG. 3A are NMOS driver transistors 330 with a depletion mode NMOS load technology 340. The load device or NMOS load transistor 340 is a depletion mode or normally "on", transistor which acts as a constant current source during the pull up switching transient thus providing high switching speed. The driver transistor 330 is an enhancement mode NMOS transistor 330 which is normally "off" with zero gate bias.

Figure 5A:
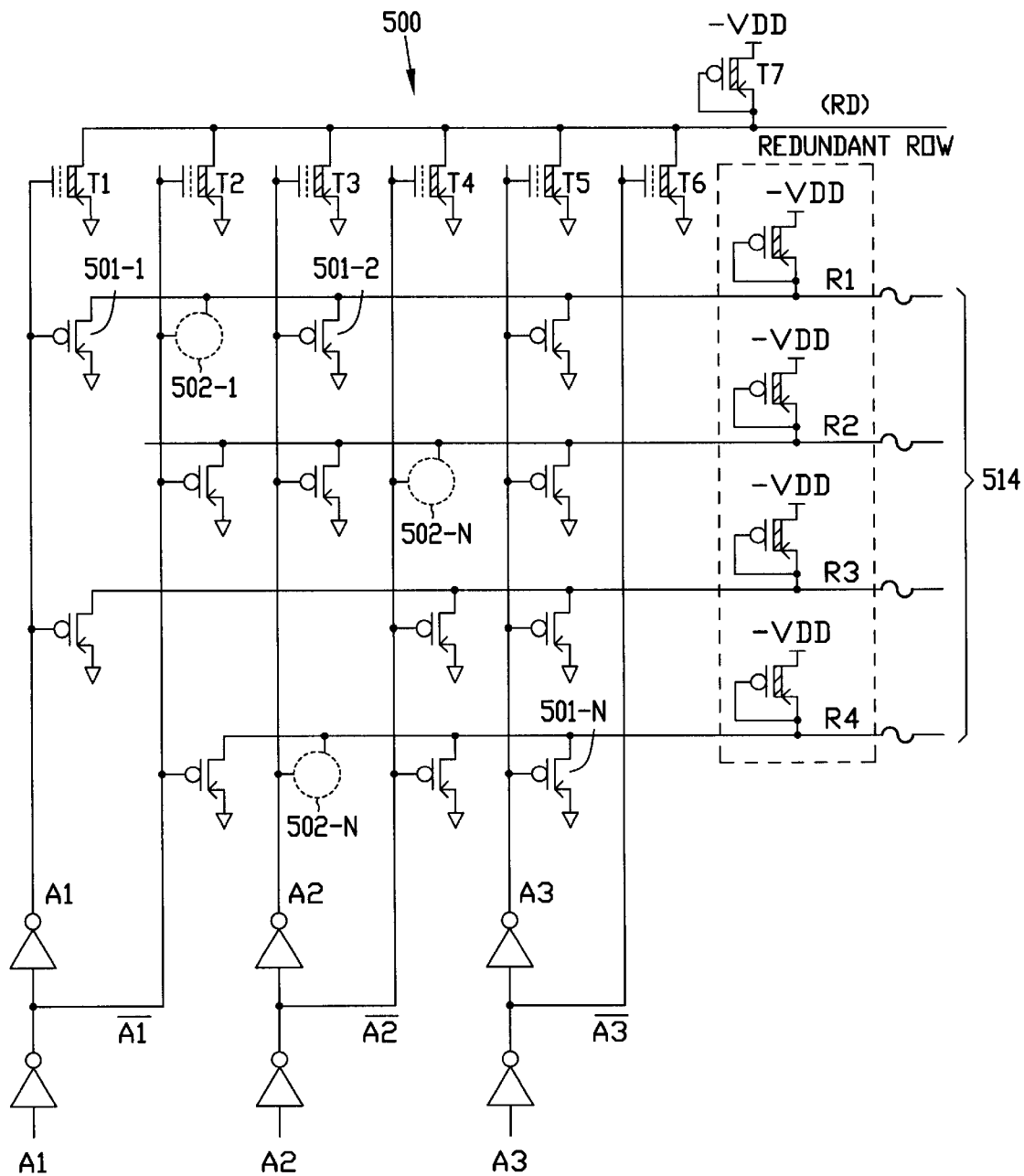
FIG. 5A is a schematic diagram illustrating one embodiment of a decode circuit, or memory address decoder, according to the teachings of the present invention.

For the decode circuit of the present invention, shown in FIG. 5A, the driver transistors, e.g. transistors 501-1, 501-2, . . . , 501-N in the array are p-channel devices and not enhancement mode n-channel transistors as is more usual. Also, the load devices 516 are depletion mode p-channel transistors and not depletion mode n-channel transistors as is more usual. Thus, the present invention is most conveniently implemented in a negative logic system rather than the more common positive logic system. In a negative logic system the "1" logic state is the most negative voltage, −VDD, and "0" the least negative voltage.

As shown in FIG. 5A, the decode circuit 500 of the present invention includes at least one redundant row line, RD. As shown in FIG. 5A a number of additional driver transistors, e.g. transistors T1–T6, are provided in the array coupled to address lines A1 through A3 or inverse address lines, $\overline{A1}$ through $\overline{A3}$ and the redundant row line, RD. A depletion mode p-channel load transistor T7, similar to depletion mode load transistors 516 is coupled to the at least one redundant row line, RD. According to the teachings of the present invention, these additional driver transistors, e.g. transistors T1–T6, include non volatile, depletion mode p-channel floating gate transistors as described above in connection with FIG. 2 and as disclosed in co-filed, co-pending, commonly assigned U.S. patent application: entitled "Static NVRAM UltraThin Tunnel Oxides,", Ser. No. 09/515,630, filed Feb. 29, 2000, which disclosure is herein incorporated by reference. As has been shown, these non volatile, depletion mode p-channel floating gate transistors, e.g. transistors T1–T6, can be programmed to have two different conductivity states depending upon whether electrons are stored on the floating gate. These two different conductivity states includes a low DC conductivity state without stored charge and a higher conductivity state when electrons are stored on the floating gate. The implementation of these non volatile, depletion mode p-channel floating gate transistors, e.g. transistors T1–T6, in the decode circuit 500 of the present invention, enables error correction for replacing a row, or column in the array as will be explained in more detail below.

One of ordinary skill in the art will understand upon reading this disclosure that there can be more than one redundant row line, e.g. a RD2, RD3, etc. (not shown), and similarly more additional non volatile, depletion mode p-channel floating gate transistors, like transistors T1–T6, coupled thereto in order to enable multiple row error correction.

Figure 4C:
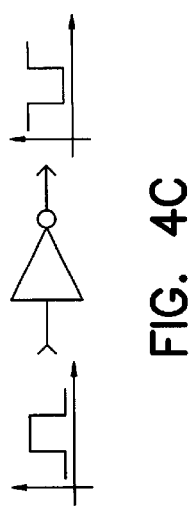
FIGS. 4A–4C illustrate a static logic depletion load inverter 400, according to the teachings of the present invention, with a depletion mode p-channel load transistor and a depletion mode p-channel floating gate driver transistor in a negative logic system.
Figure 4B:
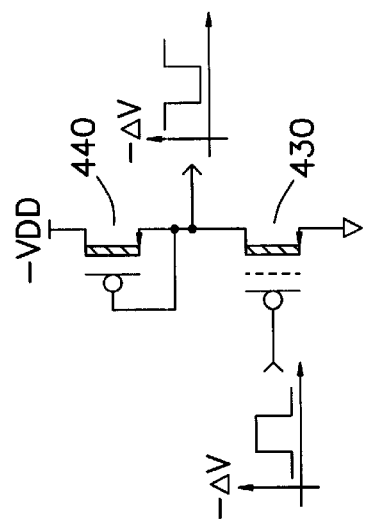
Figure 4A:
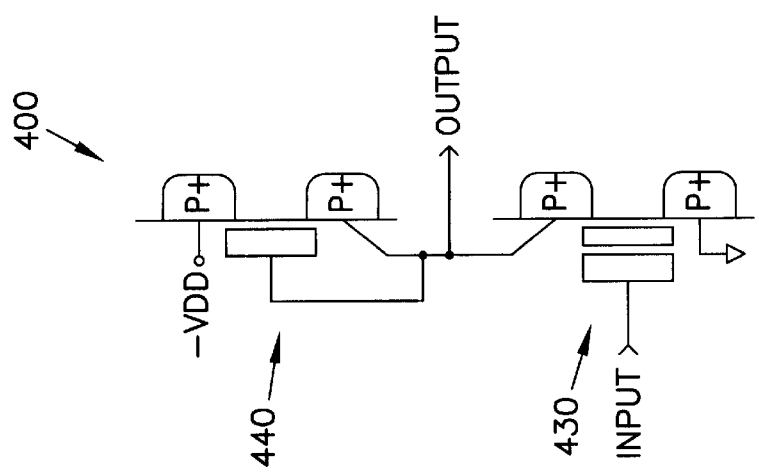

FIGS. 4A–4C describes the operation of the non volatile, depletion mode p-channel floating gate driver transistors, e.g. transistors T1–T6, in combination with the depletion mode p-channel load transistor T7 which form a depletion mode p-channel inverter 400 for use in decode circuit 500 of the present invention. FIGS. 4A–4C then shows the static logic depletion mode p-channel inverter 400, according to the teachings of the present invention. The depletion mode p-channel inverter 400, of the present invention, includes a depletion mode p-channel load transistor 440 and a non volatile, depletion mode p-channel floating gate driver transistor 430 in a negative logic system. This depletion mode p-channel load transistor 440 can be used as normal depletion mode load devices 440 since it will act as a constant current source at a low drain voltage and provide nearly ideal depletion mode load transistor characteristics. The depletion load circuit 400 of the present invention can be designed to have two different output states by appropriately selecting the size, or width to length (W/L) ratios for the driver 430 (W/L)d and depletion mode load 440 (W/L)l devices as is normally done in ratioed static inverter and logic circuits.

As explained in connection with FIG. 2, with zero volts on the control gate, and no stored charge on the floating gate of the depletion mode p-channel floating gate driver transistor 430, the driver transistor 430 is in a low conductivity state. In operation, according to the present invention, when the input gate, or control gate, voltage of the depletion mode p-channel floating gate driver transistor 430 is steps to a negative voltage −VDD, as in the negative logic "1" signal, there are two possibilities. First, if there is no stored charge on the floating gate of the depletion mode p-channel floating gate driver transistor 430, the conductivity will remain in a low state. However, if there is a stored charge of electrons on the floating gate of the depletion mode p-channel floating gate driver transistor 430, then the conductivity will be a high state, pulling the output or row line potential toward ground such that the output will become "low," less negative or inverted in a negative logic system.

In summary, if electrons are stored on the floating gate of the depletion mode p-channel floating gate driver transistor 430, then when the input steps more negative the conductivity of the driver transistor will be high and the output become less negative or inverted in a negative logic system. On the other hand, if there is no stored charge on the floating gate of the depletion mode p-channel floating gate driver transistor 430, then the conductivity of the driver will remain low and the output will not change states. In this manner the driver transistors 430 can be programmed, if they have a negative charge stored on the floating gate they will function as normal inverters as shown in FIG. 4C. That is, if the driver transistor 430 is programmed with a negative charge stored on its floating gate, then a negative logic one input, −VDD voltage, will turn on the driver hard enough to cause the output to go to a negative logic zero state or voltage near ground and result in a signal inversion. Conversely, if there is no stored charge on the floating gate, the conductivity of the driver transistors 430 will not become high enough and they will not function as driver transistors. In this later case, the output of the depletion load circuit 400 of the present invention will not change charge states. Thus, if there is no charge stored on the floating gate of the depletion mode p-channel floating gate driver transistors 430, the drivers are effectively removed from the decode circuits.

FIG. 5A is a schematic diagram illustrating one embodiment of a decode circuit, or memory address decoder, 500 according to the teachings of the present invention. Analogous to FIG. 3A, the address lines are A1 through A3 and inverse address lines, A1 through A3. The NOR decode array of FIG. 5A is programmable at the gate mask level by either fabricating a thin oxide gate transistor, or logic cell, e.g. transistors 501-1, 501-2, . . . , 501-N, at the intersection of lines in the array or not fabricating a thin oxide gate transistor, or logic cell, e.g. missing thin oxide transistors, 502-1, 502-2, . . . , 502-N, at such an intersection. In one embodiment according to the teachings of the present invention, fabricating a thin oxide gate transistor, e.g. transistors 501-1, 501-2, . . . , 501-N, at the intersection of lines in the array includes fabricating thin oxide p-channel gate transistors, e.g. transistors 501-1, 501-2, . . . , 501-N, at the intersection of lines in the array for use in a negative logic system. As one of ordinary skill in the art will understand upon reading this disclosure, the same technique is conventionally used to form other types of decode arrays not shown. As shown in FIG. 5A, a number of depletion mode transistors, 516, are used as load devices and coupled to the output lines, or row lines, 514, of the decode circuit 500. In one embodiment of the present invention, the number of depletion mode transistors, 516, include p-channel depletion mode transistors, 516, for use in a negative logic system.

Again, the incoming address on each address line A1 through A3 is inverted and the combination of the original address on each address line A1 through A3 and inverted or complemented values on inverse address lines, $\overline{A1}$ through $\overline{A3}$, used to drive the gates of transistors in the decode array 500. The transistors 501-1, 501-2, . . . , 501-N in the array 500 are enhancement mode PMOS devices and depletion mode PMOS transistors are used as load devices 516. This is a negative logic NOR decode array, the logic one state is the most negative voltage, −VDD, and the logic level zero is the most positive voltage.

In FIG. 5A, each of the row lines 514 acts as a NOR gate for the address lines A1 through A3 and inverse address lines, $\overline{A1}$ through $\overline{A3}$ that are connected to the row lines 514 through the thin oxide p-channel driver transistors, or logic cells, e.g. transistors 501-1, 501-2, . . . , 501-N, of the array. That is, in the negative logic system of the present invention, row line R1 is maintained at a high negative potential −VDD, or negative logic "1" unless one or more of the thin oxide p-channel transistors, or logic cells, e.g. transistors 501-1, 501-2, . . . , 501-N, that are coupled to row line R1 are turned on by a high logic level signal, −VDD, on one of the address lines A1 through A3 or inverse address lines, $\overline{A1}$ through $\overline{A3}$. In the decode circuit 500 configuration shown in FIG. 5A, a negative logic "1", or −VDD, on one of the address lines A1 through A3 is required in order to turn on one of the thin oxide p-channel transistors, or logic cells, e.g. transistors 501-1, 501-2, . . . , 501-N, coupled to row line R1.

As shown in the truth table of FIG. 5B, when a transistor gate address is activated by a high logic level signal, −VDD, on one of the address lines A1 through A3 or inverse address lines, $\overline{A1}$ through $\overline{A3}$, each thin oxide p-channel driver transistor, logic cell, e.g. transistors 501-1, 501-2, . . . , 501-N, conducts which performs the NOR positive logic circuit function. As shown by truth table 5B, in the decode circuit 500 embodiment of 5A, row line R1 will remain high with a negative logic "1" output, −VDD, only when address lines A1 through A3 are provided with a negative logic "0", or least negative potential. In this manner row line R1 is address by the decode circuit 500.

FIG. 5C shows the truth table for addressing row line R2 in the negative logic system decode circuit 500 configuration of FIG. 5A. In order to address row line R2, such that R2 will remain high with a negative logic "1" output, −VDD, address lines $\overline{A1}$, A2 and A3 must be provided with a negative logic "0", or least negative potential. Conversely, if a negative logic "1", or −VDD, is provided on any of these address lines, each thin oxide p-channel driver transistor, logic cell, e.g. transistors 501-1, 501-2, . . . , 501-N, having the negative logic "1", or −VDD, input to its gate conducts and performs the NOR positive logic circuit function pulling the output for the associated row line "low."

As shown in FIG. 5A, a negative power supply voltage, −VDD, and a negative logic system is being used. If the word line in the array is addressed then the line goes to a negative logic one state or the most negative voltage, −VDD. The normal enhancement mode p-channel devices are used in a NOR decode array and normal depletion mode p-channel transistors without floating gates are used as the load devices 516 pulling the word lines towards a negative logic one or −VDD voltage. Thus, this portion of the decode array of the present invention works in an analogous manner to the NMOS NOR decode array shown in FIG. 3A.

According to the teachings of the present invention, it is desirable to have redundant row lines, e.g. redundant row line RD, available to replace or error correct for row lines 514, which are determined defective or which have failed in the field. The present invention is usable to provide such error correction by replacing a row, or column, in a memory array.

Truth table 5D provides an example of the manner in which the additional devices, in decode circuit 500, e.g. the non volatile, depletion mode p-channel floating gate transistors, T1–T6, can be programmed to provide error correction and replacement of row line R2. If, row line R2 is defective in some manner, then it is desirable to have redundant row line RD pull low and output a negative logic zero, when a negative logic "1", or −VDD, is provided on address lines $\overline{A1}$, A2 and A3. According to the teachings of the present invention, this replacement or error correction can be performed by selectively programming the number of additional driver transistors, e.g. transistors T1–T6, into the array. In this embodiment of the present invention, depletion mode p-channel floating gate driver transistors, T2, T3, and T5, are "programmed into the array," that is charged, C, with negative electrons on their respective floating gates. If the gate input potential provided on any one of these floating gate driver transistors, T2, T3, and T5, by address lines $\overline{A1}$, A2 and A3, goes to a negative logic one state, −VDD, or steps negative, then the depletion mode p-channel inverter consisting of this particular transistor, i.e., T2, T3, and T5, and depletion mode p-channel load transistor T7 will operate like the depletion mode p-channel inverter 400 in FIGS. 4A–4C. The output, of redundant word line, RD, in this case will go low and output a negative logic "zero" state.

Conversely, the only way the redundant word line RD can go to a negative logic "one" state, −VDD, i.e. be addressed is if the inputs provided by address lines $\overline{A1}$, A2 and A3 to the programmed driver transistors T2, T3, and T5 are low or near ground, that is driven with a negative logic "zero" state. In this embodiment, the other additional non volatile, depletion mode floating gate driver transistors, e.g. T1, T4 and T6, are not programmed into the array. That is additional driver transistors, T1, T4, and T6, do not have a negative charge, e.g. no charge, NC, stored on their floating gate. And, even if their input goes to a negative logic one, −VDD voltage, they will not turn on hard enough to pull the redundant word line, RD, to ground.

As shown in the logic truth table in FIG. 5D, in this embodiment of selectively programming additional non volatile, depletion mode floating gate driver transistors, T2, T3, and T5, proves to be just the correct condition to decode and address row 2 in the memory array decode circuit configuration of FIG. 5A. Thus, according to the teachings of the present invention, the decode circuit 500, or memory address, has been programmed to replace defective row, word line 2 with an operable redundant word line RD by selectively programming additional non volatile, depletion mode floating gate driver transistors, T2, T3, and T5, into the decode circuit 500.

This is just one example, but as one of ordinary skill in the art will understand upon reading this disclosure, the non volatile, depletion mode p-channel floating gate driver transistors T1 through T6 can be programmed in decode circuit 500 to replace any other row in a memory array. As one of ordinary skill in the art will further understand upon reading this disclosure, if the memory array does not use PMOS transistors as logic cells, e.g. transistors 501-1, 501-2, . . . , 501-N, and is not a negative logic system but rather uses NMOS transistors as logic cells, e.g. transistors 501-1, 501-2, . . . , 501-N, then additional inverters can be used as necessary to affect the transition from one logic system to the other positive logic system while still capitalizing on the utility of the non volatile, depletion mode p-channel floating gate driver transistors T1–T6 in decode circuit 500.

Figure 6:
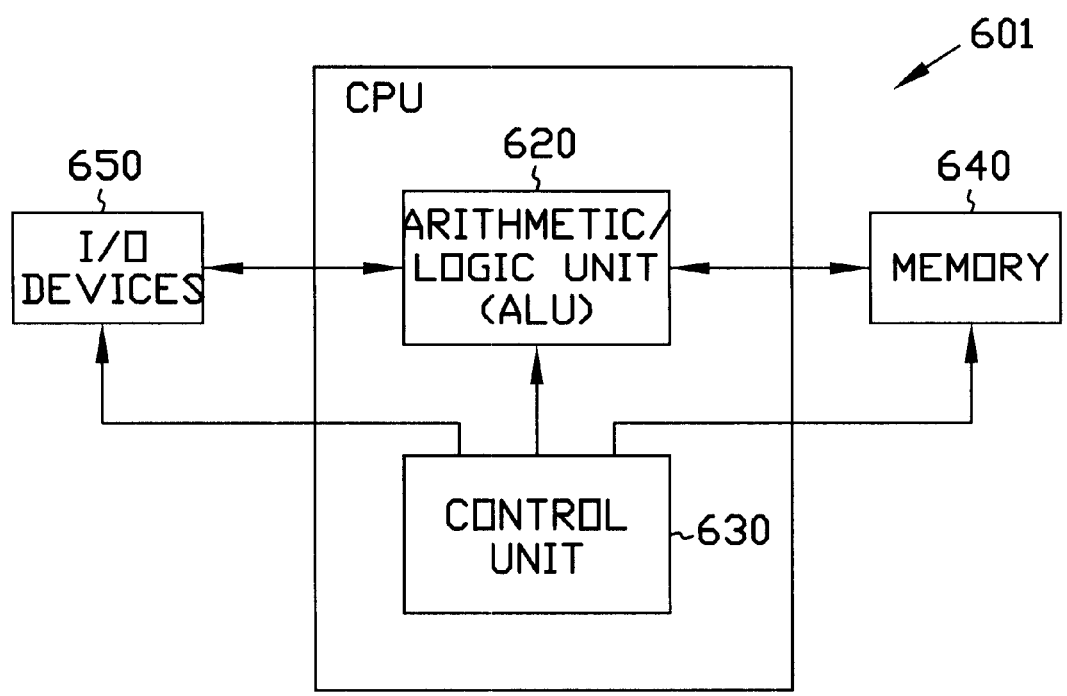
FIG. 6 is amplified block diagram of a high-level organization of an electronic system according to the teachings of the present invention

FIG. 6 is a simplified block diagram of a high-level organization of an electronic system 601 according to the teachings of the present invention. As shown in FIG. 6, the electronic system 601 is a system whose functional elements consist of an arithmetic/logic unit (ALU) 620, a control unit 630, a memory unit 640 and an input/output (I/O) device 650. Generally such an electronic system 601 will have a native set of instructions that specify operations to be performed on data by the ALU 620 and other interactions between the ALU 620, the memory unit 640 and the I/O devices 650. The memory units 640 contain the data plus a stored list of instructions.

The control unit 630 coordinates all operations of the ALU 620, the memory unit 640 and the I/O devices 650 by continuously cycling through a set of operations that cause instructions to be fetched from the memory unit 640 and executed. Memory unit 640 can be implemented with a programmable low voltage decode circuit, according to the teachings of the present invention, to enable error correction by replacing a row, or column, in a memory array.

The Figures presented and described in detail above are similarly useful in describing the methods of the present invention. That is one embodiment of the present invention includes a method for forming a decode circuit. The method includes forming a number of address lines and a number of output lines. A number logic cells are formed with gates coupled to the address lines and drain regions coupled to the output lines. A number of non volatile memory cells are formed at the intersections of the address lines and at least one output line. Forming the number of non volatile memory cells includes forming depletion mode p-channel memory cells. Forming each depletion mode p-channel memory cells includes forming a control gate coupled to an address line, forming a floating gate separated from the control gate by a dielectric layer, and forming an oxide layer of less than 50 Angstroms (Å) which separates the floating gate from a p-type doped channel region between a source and a drain region in a substrate.

According to the teachings of the present invention, forming the floating gate includes forming the floating gate to have a limited range of floating gate potentials or electron energies for which electrons can neither tunnel to the channel region or the source region nor electrons tunnel from the channel region or the source region to the floating gate. In one embodiment, forming the floating gate includes forming the floating gate such that when the floating gate is programmed with a minimal or no fixed charge on the floating gate over the limited range of floating gate potentials or electron energies, that the depletion mode p-channel memory cells are effectively removed from the array. Similarly, forming the floating gate includes forming the floating gate such that when the floating gate is programmed with a fixed charge on the floating gate over the limited range of floating gate potentials or electron energies, that the depletion mode p-channel memory cells are active in the array. Forming the decode circuit includes forming a negative logic NOR decoder array. In one embodiment, forming the oxide layer includes forming an oxide layer which is approximately 23 Angstroms (Å) thick. In one embodiment, forming the floating gate includes forming an n+ type, heavily doped, polysilicon floating gate.

Another method embodiment of the present invention includes, a method for forming a memory address decoder. The method includes forming a number of thin oxide gate transistors which have a source region, a drain region, and a channel therebetween. A number of non volatile memory cells are formed which includes forming depletion mode p-channel floating gate transistors. Forming the depletion mode p-channel floating gate transistors includes forming a channel region between source and drain regions, forming a floating gate which is adapted to hold a fixed charge over a limited range of floating gate potentials or electron energies, and forming an oxide layer of less than 30 Angstroms (Å) separating the floating gate from the channel region. A number of address lines are formed which couple to the gates of the number of thin oxide gate transistors and non volatile memory cells. A number of output lines are formed which couple to the drain region of the number of thin oxide gate transistors and non volatile memory cells. In one embodiment, forming the memory address decoder includes forming a negative logic decode circuit. In one embodiment, forming the number of thin oxide gate transistors includes forming a number of enhancement mode p-channel transistors which are selectively coupled to the number of address lines. In this embodiment, forming the memory address decoder includes forming a number of depletion mode p-channel load transistors coupled to the number of output lines. According to the teachings of the present invention, forming the number of output lines includes forming at least one redundant row line. The method further includes coupling the drain region for the number of non volatile memory cells to the at least one redundant row line. The number of non volatile memory cells are programmable, depletion mode p-channel floating gate driver transistors. In one embodiment, forming the floating gates for the number of non volatile memory cells includes forming n+ type, heavily doped, polysilicon floating gates.

Another method embodiment of the present invention includes a method for enabling error correction in a decode circuit, having a number of non volatile, depletion mode p-channel floating gate transistors coupled to a redundant row line. The method for enabling error correction includes selectively storing a limited charge on at least one of the floating gates for the number of non volatile depletion mode p-channel floating gate transistors. Selectively storing the limited charge on the at least one of the floating gates controls addressing the redundant row line. The method further includes applying a limited range of floating gate potentials to the number of non volatile, depletion mode p-channel floating gate transistors using a number of address lines such that error correction in the decode circuit is performed. As one of ordinary skill in the art will understand from reading this disclosure, this error correction includes replacing a defective row line with a redundant or replacement row line. In one embodiment, applying a limited range of floating gate potentials includes applying a limited range of floating gate potentials using a negative logic system. According to the teachings of the present invention, selectively storing a limited charge on at least one of the floating gates for the number of non volatile, depletion mode p-channel floating gate transistors includes applying a potential of less than 3.0 volts across the gate oxide for that transistor. Applying a potential of less than 3.0 volts across the gate oxide for that transistor includes applying the potential for less than 200 nanoseconds.

In one embodiment of this method, the method further includes selectively removing a limited charge on at least one of the floating gates for the number of non volatile, depletion mode p-channel floating gate transistors. Selectively removing the limited charge on the at least one of the floating gates effectively removes that non volatile, depletion mode p-channel floating gate transistor from the decode circuit. According to the teachings of the present invention, selectively removing a limited charge on at least one of the floating gates for the number of non volatile, depletion mode p-channel floating gate transistors includes applying a potential of less than 3.0 volts across the gate oxide for that transistor. Applying a potential of less than 3.0 volts across the gate oxide for that transistor includes applying the potential for less than 200 nanoseconds.

Also, according to this method of the present invention, applying a limited range of floating gate potentials to the number of non volatile, depletion mode p-channel floating gate transistors in the decode circuit includes applying a limited range of floating gate potentials of approximately +/−1.0 Volts. Applying a limited range of floating gate potentials of approximately +/−1.0 Volts includes applying the limited range of floating gate potentials of approximately +/−1.0 Volts for approximately 1.0 nanoseconds.

CONCLUSION

Thus, systems and methods for programmable low voltage decode circuits with ultra thin tunnel oxides are have been shown. The programmable low voltage decode circuits include additional non volatile, depletion mode p-channel floating gate driver transistors with ultra thin gate oxides which will operate with voltages around one Volt. The decode circuits of the present invention can be programmed with voltages in the range 2.0 to 3.0 Volts. This allows the fabrication of low voltage programmable memory address decode circuits which operate with low voltage power supplies which will be used with CMOS technology which has feature sizes of the order 0.1 $\mu$m, 1000 Å, or 100 nm.

The additional non volatile, depletion mode p-channel floating gate driver transistors are not similar to normal flash memory devices but rather employ a unique device structure and operating conditions to achieve a nonvolatile memory function. There is a range of floating gate potentials over which charge can not leak off of the floating gate since there are no final states to which the electrons can tunnel to in the silicon substrate. In this manner ultrathin gate oxides can be used as to provide a nonvolatile memory function and the transistor in the decode circuit can be programmed to perform different logic functions. Further, the decode circuits of the present invention are well suited to scale with the shrinking design rules of integrated circuit technology.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An address decoder for a memory device, comprising:
    a number of address lines;
    a number of output lines;
    wherein the address lines, and the output lines form an array;
    a number logic cells that are disposed at the intersections of output lines and address lines; and
    a number of non volatile memory cells are disposed at the intersections of the address lines and at least one output line, wherein the number of non volatile memory cells includes depletion mode p-channel memory cells including:
        a control gate;
        a floating gate separated from the control gate by a dielectric layer; and
        an oxide layer of less than 50 Angstroms (Å), wherein the oxide layer separates the floating gate from a p-type doped channel region separating a source and a drain region in a substrate.

2. The address decoder of claim 1, wherein the number of non volatile memory cells that are disposed at the intersections of the address lines and at least one output line includes non volatile, depletion mode p-channel floating gate transistors having an oxide layer of less that 30 Å.

3. The address decoder of claim 1, wherein the number of non volatile memory cells that are disposed at the intersections of the address lines and at least one output line includes programmable, depletion mode p-channel floating gate driver transistors.

4. The address decoder of claim 1, wherein the number of logic cells that are disposed at the intersections of output lines and address lines includes enhancement mode, p-channel driver transistors.

5. The address decoder of claim 1, wherein the number of non volatile memory cells that are disposed at the intersections of the address lines and at least one output line includes an output line which is a redundant row or word line.

6. The address decoder of claim 5, wherein the redundant row or word line includes a depletion mode p-channel load transistor couple thereto.

7. The address decoder of claim 6, wherein the number of non volatile memory cells which are disposed at the intersections of the address lines and at least one output line form a static or non volatile depletion mode inverter in combination with the depletion mode p-channel load transistor.

8. A decode circuit for a semiconductor memory, comprising:
    a number of thin oxide gate transistors having a source region, a drain region, and a channel therebetween;
    a number of non volatile memory cells, wherein the non-volatile memory cells each include a depletion mode p-channel static device, comprising:
        a source region;
        a drain region;
        a channel region between the source and drain regions;
        a floating gate; and
        an oxide layer of less than 50 Angstroms (Å), wherein the oxide layer separates the floating gate from the channel region;
    a number of address lines coupled to the gates of the number of thin oxide gate transistors and non volatile memory cells; and
    a number of output lines coupled to the drain region of the number of thin oxide gate transistors and non volatile memory cells.

9. The decode circuit of claim 8, wherein the decode circuit includes a negative logic decode circuit.

10. The decode circuit of claim 8, wherein the number of thin oxide gate transistors include a number of enhancement mode p-channel transistors which are selectively coupled to the number of address lines.

11. The decode circuit of claim 8, wherein the decode circuit further includes a number of depletion mode p-channel transistors coupled to the number of output lines.

12. The decode circuit of claim 8, wherein the number of output lines include at least one redundant row line.

13. The decode circuit of claim 12, wherein the drain region for the number of non volatile memory cells are coupled to the at least one redundant row line.

14. The decode circuit of claim 8, wherein the number of non volatile memory cells include programmable, depletion mode p-channel floating gate driver transistors.

15. The decode circuit of claim 8, wherein the floating gates for the number of non volatile memory cells include an n+ type, heavily doped, polysilicon floating gate.

16. The decode circuit of claim 8, wherein the floating gates for the number of non volatile memory cells have a limited range of floating gate potentials or electron energies for which electrons can neither tunnel to the channel region or the source region nor electrons tunnel from the channel region or the source region to the floating gate.

17. A memory address decoder, comprising:
    a number of thin oxide gate transistors having a source region, a drain region, and a channel therebetween;
    a number of non volatile memory cells, wherein the non-volatile memory cells each include a depletion mode p-channel floating gate transistors, comprising:
        a source region;
        a drain region;
        a channel region between the source and drain regions;
        a floating gate, wherein the floating gate is adapted to hold a fixed charge over a limited range of floating gate potentials or electron energies; and
        an oxide layer of less than 30 Angstroms (Å), wherein the oxide layer separates the floating gate from the channel region;
    a number of address lines coupled to the gates of the number of thin oxide gate transistors and non volatile memory cells; and
    a number of output lines coupled to the drain region of the number of thin oxide gate transistors and non volatile memory cells.

18. The memory address decoder of claim 17, wherein at least one of the floating gate transistors is programmed with a minimal or no fixed charge on the floating gate over the limited range of floating gate potentials or electron energies such that the floating gate transistor is effectively removed from the array.

19. The memory address decoder of claim 17, wherein at least one of the floating gate transistors is programmed with a fixed charge on the floating gate over the limited range of floating gate potentials or electron energies.

20. The memory address decoder of claim 17, wherein the limited range of floating gate electron energies for which electrons can neither tunnel to the channel region or the source region nor electrons tunnel from the channel region or the source region to the floating gate includes a charge on the order of approximately $10^{-17}$ Coulombs on the floating gates, and wherein the floating gates have a bottom surface area in contact with the oxide layer of approximately $10^{-10}$ cm$^2$.

21. The memory address decoder of claim 17, wherein the memory address decoder is operatively coupled to a computer system.

22. A negative logic address decode circuit for a memory device, comprising:
 a number of thin oxide gate transistors having a source region, a drain region, and a channel therebetween;
 a number of non volatile memory cells, wherein the non-volatile memory cells each include a depletion mode p-channel floating gate driver transistor, comprising:
  a source region;
  a drain region;
  a p-type doped channel region between the source and drain regions;
  a floating gate, wherein the floating gate is adapted to hold a fixed charge of approximately $10^{-17}$ Coulombs over a limited range of floating gate potentials or electron energies; and
  an oxide layer of less than 30 Angstroms (Å), wherein the oxide layer separates the floating gate from the channel region;
 a number of address lines coupled to the gates of the number of thin oxide gate transistors and non volatile memory cells; and
 a number of output lines coupled to the drain region of the number of thin oxide gate transistors and non volatile memory cells.

23. The negative logic address decode circuit of claim 22, wherein the negative logic address decode circuit includes a NOR address decoder.

24. The negative logic address decode circuit of claim 22, wherein the number of thin oxide gate transistors include a number of enhancement mode p-channel transistors which are selectively coupled to the number of address lines.

25. The negative logic address decode circuit of claim 22, wherein the decode circuit further includes a number of depletion mode p-channel load transistors coupled to the number of output lines.

26. The negative logic address decode circuit of claim 22, wherein the number of output lines include at least one redundant row line.

27. The negative logic address decode circuit of claim 26, wherein the at least one redundant row line is coupled to a depletion mode p-channel inverter, and wherein the depletion mode p-channel inverter includes a depletion mode p-channel load transistor and at least one of the depletion mode p-channel floating gate driver transistors.

28. The negative logic address decode circuit of claim 27, wherein a charge on the floating gate for the depletion mode p-channel floating gate driver transistor controls the operation of the at least one redundant row line.

29. The negative logic address decode circuit of claim 22, wherein the limited range of floating gate potentials includes a range of +/−1.0 Volts.

30. The negative logic address decode circuit of claim 22, wherein the depletion mode p-channel floating gate driver transistors are programmable with a fixed charge using voltages of less than 3.0 Volts.

31. An electronic system, the electronic system comprising a memory address decoder array, comprising:
 a number of thin oxide gate transistors having a source region, a drain region, and a channel therebetween;
 a number of non volatile memory cells, wherein the non-volatile memory cells each include a depletion mode p-channel floating gate transistors, comprising:
  a source region;
  a drain region;
  a channel region between the source and drain regions;
  a floating gate, wherein the floating gate is adapted to hold a fixed charge over a limited range of floating gate potentials or electron energies; and
  an oxide layer of less than 30 Angstroms (Å), wherein the oxide layer separates the floating gate from the channel region;
 a number of address lines coupled to the gates of the number of thin oxide gate transistors and non volatile memory cells; and
 a number of output lines coupled to the drain region of the number of thin oxide gate transistors and non volatile memory cells.

32. The electronic system of claim 31, wherein at least one of the floating gate transistors is programmed with a minimal or no fixed charge on the floating gate over the limited range of floating gate potentials or electron energies such that the floating gate transistor is effectively removed from the array.

33. The electronic system of claim 31, wherein at least one of the floating gate transistors is programmed with a fixed charge on the floating gate over the limited range of floating gate potentials or electron energies such that the floating gate transistor is active in the array.

34. The electronic system of claim 31, wherein the oxide layer is approximately 23 Angstroms (Å).

35. The electronic system of claim 31, wherein the limited range of floating gate potentials includes a range of +/−1.0 Volts.

36. The electronic system of claim 31, wherein the number of thin oxide gate transistors includes enhancement mode p-channel thin oxide driver transistors.

37. The electronic system of claim 31, wherein the number of output lines include at least one redundant row line.

38. The electronic system of claim 31, wherein the at least one redundant row line is coupled to a depletion mode p-channel inverter, and wherein the depletion mode p-channel inverter includes a depletion mode p-channel load transistor and at least one of the depletion mode p-channel floating gate driver transistors.

39. The electronic system of claim 31, wherein a charge on the floating gate for the depletion mode p-channel floating gate driver transistor controls the operation of the at least one redundant row line.

40. An electronic system, comprising:
 a memory device;
 a processor coupled to the memory; and
 wherein the memory device includes a memory address decoder including:
  a number of thin oxide gate transistors having a source region, a drain region, and a channel therebetween;
  a number of non volatile memory cells, wherein the non-volatile memory cells each include a depletion mode p-channel floating gate transistors, comprising:
   a source region;
   a drain region;
   a channel region between the source and drain regions;

a floating gate, wherein the floating gate transistor has a limited range of floating gate potentials or electron energies for which electrons can neither tunnel to the channel region or the source region nor electrons tunnel from the channel region or the source region to the floating gate; and an oxide layer of less than 50 Angstroms (Å), wherein the oxide layer separates the floating gate from a p-type doped channel region separating the source and the drain region;

a number of address lines coupled to the gates of the number of thin oxide gate transistors and non volatile memory cells; and a number of output lines coupled to the drain region of the number of thin oxide gate transistors and non volatile memory cells.

41. The electronic system of claim 40, wherein the processor is coupled to the memory on a single die.

42. The electronic system of claim 40, wherein at least one of the floating gate transistors is programmed with a minimal or no fixed charge on the floating gate over the limited range of floating gate potentials or electron energies such that the floating gate transistor is effectively removed from the array.

43. The electronic system of claim 40, wherein at least one of the floating gate transistors is programmed with a fixed charge on the floating gate over the limited range of floating gate potentials or electron energies such that the floating gate transistor is active in the array.

44. The electronic system of claim 40, wherein the oxide layer is approximately 23 Angstroms (Å).

45. The electronic system of claim 40, wherein the limited range of floating gate potentials includes a range of +/−1.0 Volts.

46. A method for forming a decode circuit, comprising:
forming a number of address lines;
forming a number of output lines;
forming a number logic cells having gates coupled to the address lines and drain regions coupled to the output lines; and
forming a number of non volatile memory cells at the intersections of the address lines and at least one output line, wherein forming the number of non volatile memory cells includes forming depletion mode p-channel memory cells including:
forming a control gate coupled to an address line;
forming a floating gate separated from the control gate by a dielectric layer; and
forming an oxide layer of less than 50 Angstroms (Å) separating the floating gate from a p-type doped channel region between a source and a drain region in a substrate.

47. The method of claim 46, wherein forming the floating gate includes forming the floating gate to have a limited range of floating gate potentials or electron energies for which electrons can neither tunnel to the channel region or the source region nor electrons tunnel from the channel region or the source region to the floating gate.

48. The method of claim 46, wherein forming the floating gate includes forming the floating gate such that when the floating gate is programmed with a minimal or no fixed charge on the floating gate over the limited range of floating gate potentials or electron energies, that the depletion mode p-channel memory cells are effectively removed from the array.

49. The method of claim 46, wherein forming the floating gate includes forming the floating gate such that when the floating gate is programmed with a fixed charge on the floating gate over the limited range of floating gate potentials or electron energies, that the depletion mode p-channel memory cells are active in the array.

50. The method of claim 46, wherein forming the decode circuit includes forming a negative logic NOR decoder array.

51. The method of claim 46, wherein forming the oxide layer includes forming an oxide layer which is approximately 23 Angstroms (Å) thick.

52. The method of claim 46, wherein forming the floating gate includes forming an n+ type, heavily doped, polysilicon floating gate.

53. A method for forming a memory address decoder, comprising:
forming a number of thin oxide gate transistors having a source region, a drain region, and a channel therebetween;
forming a number of non volatile memory cells, wherein forming the non-volatile memory cells includes forming depletion mode p-channel floating gate transistors, comprising:
forming a channel region between source and drain regions;
forming a floating gate which is adapted to hold a fixed charge over a limited range of floating gate potentials or electron energies; and
forming an oxide layer of less than 30 Angstroms (Å) separating the floating gate from the channel region;
forming a number of address lines coupled to the gates of the number of thin oxide gate transistors and non volatile memory cells; and
forming a number of output lines coupled to the drain region of the number of thin oxide gate transistors and non volatile memory cells.

54. The method of claim 53, wherein forming the memory address decoder includes forming a negative logic decode circuit.

55. The method of claim 53, wherein forming the number of thin oxide gate transistors includes forming a number of enhancement mode p-channel transistors which are selectively coupled to the number of address lines.

56. The method of claim 53, wherein forming the memory address decoder includes forming a number of depletion mode p-channel load transistors coupled to the number of output lines.

57. The method of claim 53, wherein forming the number of output lines includes forming at least one redundant row line.

58. The method of claim 57, wherein the method further includes coupling the drain region for the number of non volatile memory cells to the at least one redundant row line.

59. The method of claim 53, wherein forming the number of non volatile memory cells includes forming programmable, depletion mode p-channel floating gate driver transistors.

60. The method of claim 53, wherein forming the floating gates for the number of non volatile memory cells includes forming n+ type, heavily doped, polysilicon floating gates.

61. A method for enabling error correction in a decode circuit, having a number of non volatile, depletion mode p-channel floating gate transistors coupled to a redundant row line, comprising:
selectively storing a limited charge on at least one of the floating gates for the number of non volatile depletion mode p-channel floating gate transistors, wherein selectively storing the limited charge on the at least one of the floating gates controls addressing the redundant row line; and applying a limited range of floating gate potentials to the number of non volatile, depletion mode p-channel floating gate transistors using a number of address lines.

62. The method of claim 61, wherein applying a limited range of floating gate potentials includes applying a limited range of floating gate potentials using a negative logic system.

63. The method of claim 61, wherein selectively storing a limited charge on at least one of the floating gates for the number of non volatile, depletion mode p-channel floating gate transistors includes applying a potential of less than 3.0 volts across the gate oxide for that transistor.

64. The method of claim 63, wherein applying a potential of less than 3.0 volts across the gate oxide for that transistor includes applying the potential for less than 200 nanoseconds.

65. The method of claim 61, wherein the method further includes selectively removing a limited charge on at least one of the floating gates for the number of non volatile, depletion mode p-channel floating gate transistors, wherein selectively removing the limited charge on the at least one of the floating gates effectively removes that non volatile, depletion mode p-channel floating gate transistor from the decode circuit.

66. The method of claim 65, wherein selectively removing a limited charge on at least one of the floating gates for the number of non volatile, depletion mode p-channel floating gate transistors includes applying a potential of less than 3.0 volts across the gate oxide for that transistor.

67. The method of claim 66, wherein applying a potential of less than 3.0 volts across the gate oxide for that transistor includes applying the potential for less than 200 nanoseconds.

68. The method of claim 61, wherein applying a limited range of floating gate potentials to the number of non volatile, depletion mode p-channel floating gate transistors in the decode circuit includes applying a limited range of floating gate potentials of approximately +/−1.0 Volts.

69. The method of claim 61, wherein applying a limited range of floating gate potentials of approximately +/−1.0 Volts includes applying the limited range of floating gate potentials of approximately +/−1.0 Volts for approximately 1.0 nanoseconds.

* * * * *

UNITED STATES PATENT AND TRADEMARK OFFICE
CERTIFICATE OF CORRECTION

PATENT NO. : 6,351,428 B2
DATED : February 26, 2002
INVENTOR(S) : Forbes

It is certified that error appears in the above-identified patent and that said Letters Patent is hereby corrected as shown below:

Column 5,
Line 5, delete "diagram" and insert -- diagrams --, therefor.

Column 16,
Line 50, after "number" insert -- of --.

Column 18,
Line 44, delete "are".

Column 19,
Line 32, delete "that" and insert -- than --, therefor.

Signed and Sealed this

Twenty-fifth Day of June, 2002

Attest:

JAMES E. ROGAN
Attesting Officer
Director of the United States Patent and Trademark Office